US012385980B1

United States Patent
Ozdemir et al.

(10) Patent No.: US 12,385,980 B1
(45) Date of Patent: Aug. 12, 2025

(54) SYSTEMS AND METHODS FOR ACCURATELY PREDICTING STATE OF CHARGE IN BATTERY POWERED SYSTEMS

(71) Applicant: EATRON TECHNOLOGIES LIMITED, Warwick (GB)

(72) Inventors: Halil Umut Ozdemir, Istanbul (TR); Ali Ibrahim Ozkan, Istanbul (TR); Muharrem Ugur Yavas, Istanbul (TR); Can Erhan, Istanbul (TR); Can Kurtulus, Istanbul (TR)

(73) Assignee: Eatron Technologies Limited, Warwick (GB)

( * ) Notice: Subject to any disclaimer, the term of this patent is extended or adjusted under 35 U.S.C. 154(b) by 0 days.

(21) Appl. No.: 19/050,922

(22) Filed: Feb. 11, 2025

(51) Int. Cl.
*G01R 31/388* (2019.01)
*G01R 31/367* (2019.01)
*G01R 31/374* (2019.01)

(52) U.S. Cl.
CPC ......... *G01R 31/388* (2019.01); *G01R 31/367* (2019.01); *G01R 31/374* (2019.01)

(58) Field of Classification Search
None
See application file for complete search history.

(56) References Cited

U.S. PATENT DOCUMENTS

2005/0194936 A1* 9/2005 Cho ...................... G01R 31/367
320/132

* cited by examiner

Primary Examiner — Jas A Sanghera
(74) Attorney, Agent, or Firm — Dickinson Wright PLLC; Jonathan H. Harder

(57) ABSTRACT

In one aspect, a computer-implemented may include receiving, from sensors, measurements comprising battery cell voltage, current, temperature, or some combination thereof. The method may include determining, via first computer-implemented models using the measurements, a state of charge prediction, wherein the first computer-implemented models are initially trained to determine the state of charge prediction using a first training dataset comprising data pertaining to a plurality of battery cells and are additionally trained to determine the state of charge prediction using a second training dataset comprising data pertaining to a target battery cell. The method may include transmitting parameters of the first computer-implemented models to an edge processing device to cause the edge processing device to execute at least a portion of the first computer-implemented models to predict the state of charge prediction and to display the state of charge prediction on a user interface.

20 Claims, 17 Drawing Sheets

SYSTEMS AND METHODS FOR ACCURATELY PREDICTING STATE OF CHARGE IN BATTERY POWERED SYSTEMS

TECHNICAL FIELD

This disclosure relates generally to assets and batteries. More specifically, this disclosure relates to systems and methods for accurately predicting state of charge in battery powered systems.

BACKGROUND

Reliance on battery-powered devices and systems continues to increase. For example, such devices and systems range from electric vehicles and renewable energy storage to consumer electronics and wearable computing devices. Determining a battery's state of charge may provide numerous benefits and/or advantages. However, inaccurate state of charge prediction may shorten battery life, which may lead to increased costs and environmental impact. Further, performance may suffer for a device or system powered by a battery affected by an inaccurate state of charge prediction.

SUMMARY

In one aspect, a computer-implemented method may include receiving, from one or more sensors, one or more measurements comprising battery cell voltage, current, temperature, or some combination thereof, and determining, via one or more first computer-implemented models using the one or more measurements, a state of charge prediction. The one or more first computer-implemented models may be initially trained to determine the state of charge prediction using a first training dataset comprising data pertaining to a set of battery cells generated based on at least one of state of charge tests of the set of battery cells, open-circuit voltage tests of the set of battery cells, and drive cycle tests of the set of battery cells. The one or more first computer-implemented models may be additionally trained to determine the state of charge prediction using a second training dataset including data pertaining to a target battery cell generated based on at least one of state of charge tests of the target battery cell, open-circuit voltage tests of the target battery cell, and drive cycle tests of the target battery cell. The method may include transmitting one or more parameters of the one or more first computer-implemented models to an edge processing device to cause the edge processing device to execute at least a portion of the one more first computer-implemented models to predict the state of charge prediction and to display the state of charge prediction on a user interface and/or to control operation of a battery pack based on the state of charge prediction.

In one aspect, a computer-implemented method may include generating, at a cloud-based computing system, a computer-implemented model including a domain adaptation architecture, wherein the computer-implemented model is trained to predict a state of charge of a target battery cell, and the domain adaptation architecture a first private encoder that is pre-trained using first data pertaining to a set of battery cells in a fleet, a shared encoder that is trained using the first data and second data pertaining to a target battery cell, and a computer-implemented predictor that is trained to predict the state of charge of the target battery cell using output from the first private encoder and the shared encoder. The method may include deploying, to an edge processing device, the shared encoder and the predictor to cause the edge processing device to predict the state of charge of the target battery cell when sensor data pertaining to a battery pack is received by the edge processing device.

In one aspect, a computer-implemented method may include receiving, at an edge processing device from one or more sensors, data pertaining to a battery pack of a vehicle, wherein the data includes a temperature, a voltage, a current, an Ampere-hour count, a state of health of the battery pack, or some combination thereof. Based on the data, the method may include determining, using one or more computer-implemented models executed via the edge processing device, a state of charge of the battery pack, wherein the one or more computer-implemented models includes (i) a first component trained to process the data to generate processed data and (ii) a second component trained to use the processed data to predict the state of charge of the battery pack. The method may include displaying, using the edge processing device, the state of charge of the battery pack on a user interface of a display.

In one aspect, a computer-implemented method may include generating, using a cloud-based computing system, a computer-implemented model trained to predict at least a state of charge of a battery pack, wherein the computer-implemented model includes one or more pre-trained components including one or more frozen weights and one or more tunable components including one or more tunable weights. The method may include receiving sensor data pertaining to a target cell of a battery pack, determining, using the one or more tunable components, a set of auxiliary task predictions, determining if a difference between the set of auxiliary task predictions and the sensor data satisfies an error threshold. responsive to determining the difference satisfies the error threshold, modifying, using fleet data, the one or more tunable weights of the one or more tunable components while leaving the one or more frozen weights of the one or more pre-trained components unmodified, and transmitting, to an edge processing device, the one or more tunable weights to cause the one or more tunable components to be updated at the edge processing device.

In another aspect, one or more tangible, non-transitory computer-readable media may store instructions and one or more processing devices may execute the instructions to perform one or more operations of any method disclosed herein.

In another aspect, a method may include one or more operations implemented by computer instructions and performed by one or more processing devices to perform the techniques disclosed herein.

In another aspect, a system may include one or more memory devices storing instructions and one or more processing devices communicatively coupled to the one or more memory devices. The one or more processing devices may execute the instructions to perform the techniques disclosed herein.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, independent of whether those elements are in physical contact with one another. The terms "transmit," "receive," and "communicate," as well as derivatives thereof, encompass both direct and indirect communication.

The terms "transmit," "receive," and "communicate," as well as derivatives thereof, encompass both communication with remote systems and communication within a system, including reading and writing to different portions of a memory device. The terms "include" and "comprise," as well as derivatives thereof, mean inclusion without limitation. The term "or" is inclusive, meaning or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "translate" may refer to any operation performed wherein data is input in one format, representation, language (computer, purpose-specific, such as drug design or integrated circuit design), structure, appearance or other written, oral or representable instantiation and data is output in a different format, representation, language (computer, purpose-specific, such as drug design or integrated circuit design), structure, appearance or other written, oral or representable instantiation, wherein the data output has a similar or identical meaning, semantically or otherwise, to the data input. Translation as a process includes but is not limited to substitution (including macro substitution), encryption, hashing, encoding, decoding or other mathematical or other operations performed on the input data. The same means of translation performed on the same input data will consistently yield the same output data, while a different means of translation performed on the same input data may yield different output data which nevertheless preserves all or part of the meaning or function of the input data, for a given purpose. Notwithstanding the foregoing, in a mathematically degenerate case, a translation can output data identical to the input data. The term "controller" means any device, system or part thereof that controls at least one operation. Such a controller may be implemented in hardware or a combination of hardware and software or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable storage medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable storage medium" includes any type of medium capable of being accessed by a computer, such as read only memory (ROM), random access memory (RAM), a hard disk drive, a compact disc (CD), a digital video disc (DVD), solid state drive (SSD), or any other type of memory. A "non-transitory" computer readable storage medium excludes wired, wireless, optical, or other communication links that transport transitory electrical or other signals. A non-transitory computer readable storage medium includes media where data can be permanently stored and media where data can be stored and later overwritten, such as a rewritable optical disc or an erasable memory device.

A battery cell may refer to most basic unit of a battery. A battery cell may include an anode, cathode, and electrolyte. These components may allow for the movement of ions, creating an electric charge. Battery cells are often combined into larger structures to enable storing enough energy to power certain devices and/or systems.

Battery modules may be made up of multiple interconnected cells. The cells within a module may be connected in different ways (series, parallel, or in combination) to achieve a desired electrical output. Series connections increase voltage, while parallel connections increase capacity (measured in Ampere-hours, Ah). The exact configuration can vary depending on the specific requirements of an application.

A battery pack is made up of numerous modules and may include additional components to manage and protect the battery system.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of this disclosure and its advantages, reference is now made to the following description, taken in conjunction with the accompanying drawings, in which.

DETAILED DESCRIPTION

Figure 1:
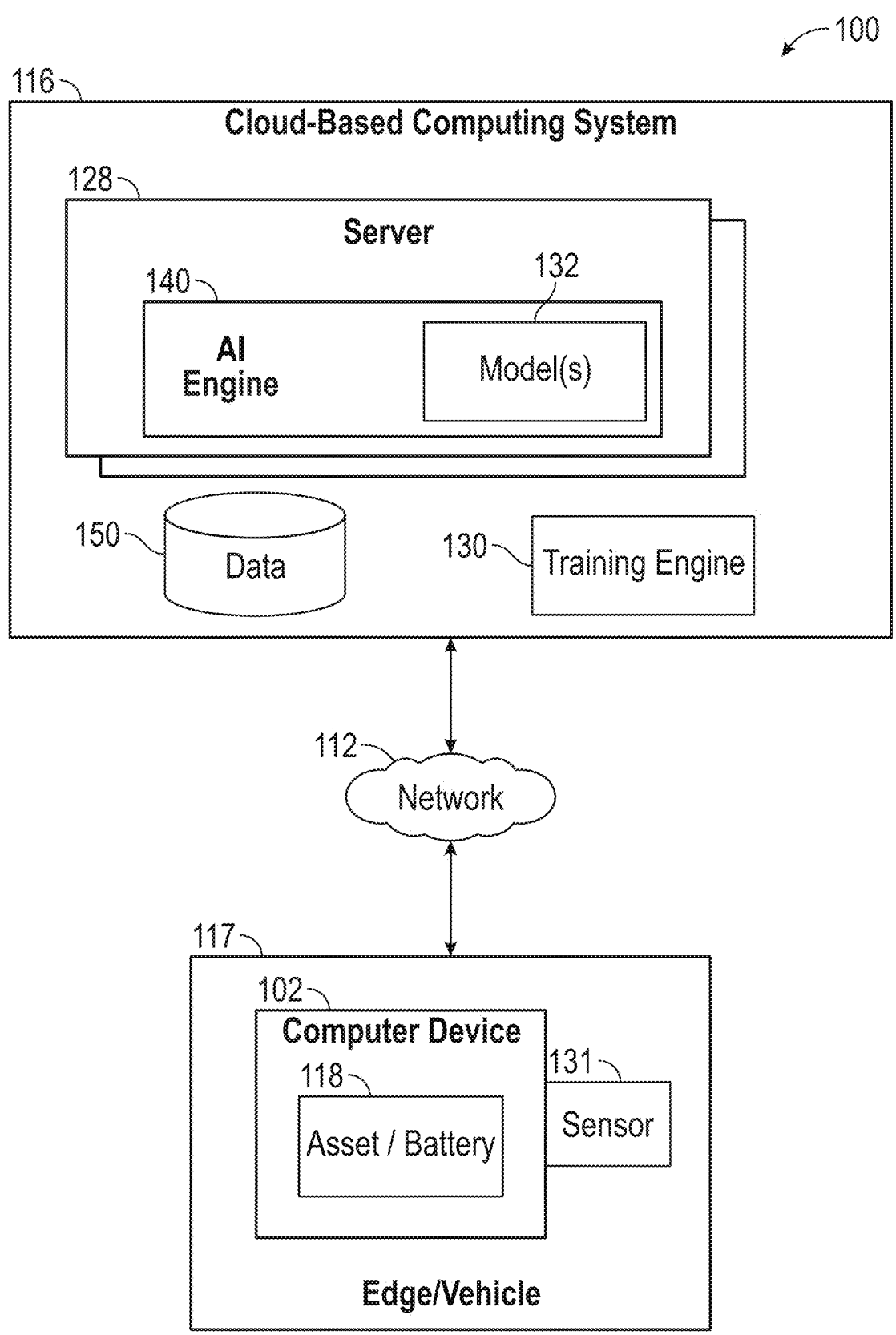
FIG. 1 illustrates a high-level component diagram of an illustrative system architecture according to certain embodiments of this disclosure.

Lithium-ion batteries (LIBs) are now widely used across various fields, from consumer electronics and electric vehicles to large-scale grid storage. This broad adoption may be due to their high energy density, extended cycle life, and steadily decreasing costs.

A battery cell is the most basic unit of a battery. The battery cell contains an anode, cathode, and electrolyte. These components allow for the movement of ions, creating an electric charge. By themselves, battery cells often don't store enough energy, nor provide a high enough potential (voltage) for many practical applications, which is why they are often combined into larger structures referred to as "cell patterns" and battery packs.

Battery packs are made up of multiple interconnected battery cells, supercells, and modules. The battery cells are usually connected in parallel to create supercells. Supercells may have the same voltage of a single cell but the supercells may be more powerful in terms of capacity measured in Ampere hours (AH). Voltage sensors may reside at the supercell level. Series connections may increase voltage, while parallel connections may increase capacity (measured in AH). Supercells may be connected in series to form modules to achieve desired voltage output. Modules may include or be associated with temperature sensors. In some cases, a single temperature sensor may monitor multiple modules, for example, two. The exact module configuration may vary depending on the specific electrical and cooling requirements of the application for the modules. Modules may then be connected in series and/or in parallel to create a battery pack with required voltage, current, power and cooling requirements. Current sensors may reside and/or be disposed and/or connected at the battery pack level. Battery packs may have additional components such as current limiters, liquid coolers etc. to protect it.

In summary, a battery cell is the smallest unit of a battery, supercells are formed by connecting a number of cells in parallel, modules are made up of multiple serially connected supercells, and a battery pack is made up of multiple modules connected in series and parallel. Battery packs commonly will include additional components to manage and protect the system. This hierarchical structure may allow for the creation of energy storage systems with a wide range of electrical specifications, physical sizes and performance characteristics, meeting the diverse needs of different applications. As discussed herein, these varying structures within battery packs may be referred to as cell patterns. Cell patterns may influence battery performance.

A factor of LIB performance is accurate state of charge (SOC) estimation and/or prediction, which may play a pivotal role in ensuring both operational efficiency and safety. Monitoring and maintaining an optimal SOC is crucial, as it may significantly impact battery lifespan and reliability across applications. SOC may be an important parameter in managing and understanding the performance of lithium-ion batteries. SOC represents the remaining capacity of a battery relative to its full capacity, usually expressed as a percentage where remaining capacity is the current charge or energy left in the battery, and full capacity is the maximum charge or energy the battery can hold (often called the nominal capacity when the battery is new). As the battery ages, this full capacity may decrease; for example, a new battery may have an initial full capacity of 100 Ah, but as it ages, it might reduce to 90 Ah, in other words 90% state of health (SOH). The full capacity used in the SOC calculation may adjust accordingly to reflect this change.

Accurate SOC estimation may be essential for applications across consumer electronics, electric vehicles, and grid storage, as it may help ensure optimal performance, maximize battery life, and maintain safety standards. Keeping SOC within an optimal range may prevent issues such as over-discharging or over-charging, which can reduce efficiency, and/or shorten lifespan, among other things.

In some embodiments of this disclosure, techniques may utilize domain adaptation to reduce reliance on large datasets when training of SOC machine learning models and/or other computer-implemented models for specific battery cells and/or battery packs. This approach provides a technical solution by achieving accurate modeling while also leveraging information from diverse datasets, effectively decreasing the data requirements for particular cells and reducing time-to-market and increasing prediction accuracy while reducing processing resource bandwidth requirements on edge processing devices. Further, the accurate SOC predictions enabled in some embodiments may allow for controlling operation of a vehicle and/or battery pack by modifying one or more operating parameters. The control may change a speed of the vehicle, change revolutions per minute, change parameter of the battery pack (e.g., charge faster/slower, discharge faster/slower, consume more/less current, consume more/less voltage, etc.), and the like. For example, an edge processing device may be communicatively connected to a battery pack and/or a control system of the vehicle and may execute control instructions that cause operation of the battery pack and/or vehicle to change. The control instructions may be received from a cloud-based computing system. The cloud-based computing system may cause the edge processing device to control operation of the vehicle and/or battery pack (e.g., modify charging and/or discharging parameters and/or properties) by executing the control instructions.

The disclosed techniques may be leveraged in any suitable industry that uses batteries, such as electric vehicles, consumer electronics, renewable energy storage, aerospace, telecommunications, and personal devices like laptops, smartphones, electronic watches, rings, and other wearable computing devices. The techniques may be used with different types of battery technologies, such as lithium batteries and solid state batteries.

In some embodiments, the disclosed techniques may pretrain one or more computer-implemented models on datasets from multiple battery cells with varying chemistries, capacities, and conditions to capture generalized battery behavior. A cloud-based computing system may augment the training dataset in pre-training using simulation techniques to cover edge cases or rare conditions. Further, the cloud-based computing system may incorporate domain-specific knowledge by fine-tuning the computer-implemented models using data from a target battery cell. Some embodiments may use multiple encoders (shared and private) to separate general features from domain-specific features, which may ensure effective transfer learning while maintaining predictive accuracy. Such techniques may reduce the need for extensive testing on the targeted cell, which may accelerate time-to-market and lowering development costs. Some embodiments may increase state of charge (SOC) prediction accuracy while reducing CPU bandwidth requirements on the edge processing devices.

In some embodiments, the cloud-based computing system may train the computer-implemented models on tasks such as reconstructing auxiliary tasks from partial data to capture intrinsic battery behaviors. Learned representations may be leveraged to enhance SOC predictions, particularly in scenarios with limited labeled data. Such techniques may reduce the need for extensive labeled datasets while capturing intrinsic battery behaviors. Additionally, continuous learning may be used to maintain accuracy of the computer-implemented models by tracking prediction accuracy across the fleet. The cloud-based computing system may use adaptive model updates when deviations in predictions (e.g., diverging from auxiliary tasks) are detected and fine-tune and redeploy at least portions of the computer-implemented models to the edge processing devices. Such techniques may facilitate the computer-implemented model optimization regularly, and improves SOC accuracy over time.

Some of the disclosed embodiments may increase the accuracy of SOC predictions by capturing edge and unseen cases, while simultaneously reducing the need for extensive testing. Some embodiments may accelerate time-to-market for new batteries in phones, domestic appliances, EV's while ensuring continuous performance tracking throughout the product's lifecycle, which may enable sustained accuracy in SOC estimation over time.

Some technical benefits of the disclosed embodiments include introducing domain adaptation and self-supervised learning technology to an SOC prediction task. Some embodiments use a domain adaptation method that enables the computer-implemented model to adjust to different battery types and operating conditions, ensuring accurate predictions even when data from various sources or battery chemistries are involved. Additionally, by incorporating self-supervised learning, the computer-implemented model may learn useful representations from un-labelled or partially labelled data, making it effective even with limited data.

In the fine-tuning phase, the computer-implemented model may be adapted to a specific battery type with minimal additional data, maintaining high accuracy without requiring extensive testing. This approach may allow the computer-implemented model to perform well during the deployment phase, even with small datasets. Further, some embodiments may use continuous learning, improving accuracy of SOC estimation better as time goes by. Some embodiments may enable precise SOC estimation for aged batteries, extending accuracy for years beyond the capabilities of standard approaches.

The disclosed techniques may apply to existing lithium ion battery technologies. Some embodiments can be used in any other industry that relies on rechargeable batteries. Examples include electric vehicles, consumer electronics, renewable energy storage, and personal devices like laptops, mobile phones, electronic watches, rings, and other wearable computing devices. Some embodiments can operate efficiently on a wide range of devices, enabling real-time SOC monitoring, ensuring accurate predictions and extending the model's applicability across diverse environments.

FIGS. 1 through 17, discussed below, and the various embodiments used to describe the principles of this disclosure are by way of illustration only and should not be construed in any way to limit the scope of the disclosure.

FIG. 1 illustrates a high-level component diagram of an illustrative system architecture 100 according to certain embodiments of this disclosure. In some embodiments, the system architecture 100 may include a cloud-based computing system 116, a computing device 102, and a vehicle 117 communicatively coupled via a network 112. The cloud-based computing system 116 may be a real-time software platform, include privacy software or protocols, or include security software or protocols. Each of the computing device 102 and components included in the cloud-based computing system 116 may include one or more processing devices, memory devices, or network interface cards. The network interface cards may enable communication via a wireless protocol for transmitting data over short distances, such as Bluetooth, ZigBee, NFC, etc. Additionally, the network interface cards may enable communicating data via a wired protocol over short or long distances, and in one example, the computing device 102 and/or the cloud-based computing system 116 may communicate with the network 112. Network 112 may be a public network (e.g., connected to the Internet via wired (Ethernet) or wireless (WiFi)), a private network (e.g., a local area network (LAN) or wide area network (WAN)), or a combination thereof. In some embodiments, network 112 may also comprise a node or nodes on the Internet of Things (IoT).

The computing device 102 may be any suitable computing device, such as an embedded computer device with display, a laptop, tablet, smartphone, or computer. The computing device 102 may be included within a vehicle, such as an electric vehicle. The computing device 102 may include a display capable of presenting a user interface of an application. The application may be implemented in computer instructions stored on the one or more memory devices of the computing device 102 and executable by the one or more processing devices of the computing device 102. The computing device 102 may include an asset and/or battery pack 118, each of which may have a useful life that degrades over time. The asset and/or battery pack 118 may be used to charge and power a vehicle (e.g., electric vehicle), smartphone, appliance, or any suitable device that uses a battery. The asset and/or battery pack 118 may be separate from or integrated with the computing device 102 within the vehicle 117. The asset and/or battery pack 118 may be communicatively coupled to the computing device 102 and one or more devices of the vehicle 117.

The user interface may present various screens to a user that present various views including notifications of a state of charge of one or more battery cells, battery modules, and/or battery packs. The user interface may enable performing a preventive action such as presenting a signal (e.g., warning signal that the state of charge is degrading or low) and/or changing an operating parameter of the vehicle (e.g., consume less energy from the battery pack, stop using one or more cells of the battery pack, etc.), and the like. The computing device 102 may also include instructions stored on the one or more memory devices that, when executed by the one or more processing devices of the computing device 102, perform operations of any of the methods described herein.

The vehicle 117 may be any suitable type of vehicle or electric vehicle, such as an automobile, a motorcycle, a boat, an airplane, a bicycle, a scooter, a skateboard, roller skates, roller blades, a unicycle, a surfboard, a drone, or the like. Accordingly, the vehicle 117 may include an engine that is powered by one or more batteries, assets, and motors. The vehicle 117 may also include one or more sensors 131 that are configured to measure any suitable parameter of a vehicle (e.g., a temperature of the vehicle 117, a vibration of the vehicle 117, etc.), a battery cell (e.g., a battery cell voltage, a battery cell temperature, a battery cell current, a battery cell capacitance, a battery cell resistance, etc.), a battery module (e.g., a battery module voltage, a battery module current, a battery module temperature, a battery module capacitance, a battery module resistance, etc.), a battery pack (e.g., a battery pack voltage, a battery pack current, a battery pack temperature, a battery pack capacitance, a battery pack resistance, etc.), and the like. The sensors 131 may include an accelerometer, a current sensor, a voltage sensor, a temperature sensor, a thermal sensor, a camera, a capacitance sensor, a resistance sensor, a pressure senor, or the like. The processing device of the vehicle 117 may receive the measurements from the one or more sensors 131 and transmit them via the network 112 to the cloud-based computing system 116 for use in determining at least a state of charge of the vehicle 117. To that end, the computing device 102 of the vehicle 117 may operate a battery management system configured to use telemetry to transmit the measured sensor data to the cloud-based computing system 116.

The processing device of the vehicle 117 may be included in a control system of the vehicle or the computing device 102. In some embodiments, the computing device 102 is the control system of the vehicle 117. The processing device of the vehicle 117 or the computing device 102 may be referred to as an edge processing device herein.

In some embodiments, the cloud-based computing system 116 may include one or more servers 128 that form a distributed computing system, which may include a cloud computing system. The servers 128 may be a rackmount server, a router, a personal computer, a portable digital assistant, a mobile phone, a laptop computer, a tablet computer, a camera, a video camera, a netbook, a desktop computer, a media center, any other device capable of functioning as a server, or any combination of the above. Each of the servers 128 may include one or more processing devices, memory devices, data storage, or network interface cards. The servers 128 may be in communication with one another via any suitable communication protocol. The memory devices of the servers 128 may store instructions implementing one or more software applications that, when executed by one or more processing devices of the servers 128, perform the techniques and methodologies described herein.

The servers 128 may execute an artificial intelligence engine 140 and one or more computer-implemented models 132. That is, the servers 128 may execute an artificial intelligence (AI) engine 140 that uses and/or executes one or more computer-implemented models 132 to perform at least one of the embodiments disclosed herein. The artificial intelligence engine 140 may be implemented in computer instructions stored on one or more memory devices and executed by one or more processing devices. The cloud-based computing system 116 may also include a database 150 that stores data, knowledge, and data structures used to perform various embodiments. For example, the database 150 may store fleet of electric vehicles' data, battery data (e.g., cell voltage measurements, cell temperature measurements, z-scores, etc.) received from a manufacturer of the battery, lab experiment data pertaining to the battery, user battery usage profile, etc. Although depicted separately from the server 128, in some embodiments, the database 150 may be hosted on one or more of the servers 128.

In some embodiments, the cloud-based computing system 116 may include a training engine 130 capable of generating one or more computer-implemented models 132. Although depicted separately from the AI engine 140, the training engine 130 may, in some embodiments, be included in the AI engine 140 executing on the server 128. In some embodiments, the AI engine 140 may use the training engine 130 to generate the computer-implemented models 132 trained to perform inferencing and/or predicting operations. The computer-implemented models 132 may be trained to predict state of charge of a battery pack and/or battery cells, among other things. The one or more computer-implemented models 132 may be generated by the training engine 130 and may be implemented in computer instructions executable by one or more processing devices of the training engine 130 or the servers 128. To generate the one or more computer-implemented models 132, the training engine 130 may train the one or more computer-implemented models 132. The one or more computer-implemented models 132 may be used by any of the methods described herein.

The training engine 130 may be a rackmount server, a router, a personal computer, a portable digital assistant, a smartphone, a laptop computer, a tablet computer, a netbook, a desktop computer, an Internet of Things (IoT) device, any other desired computing device, or any combination of the above. The training engine 130 may be cloud-based, be a real-time software platform, include privacy software or protocols, or include security software or protocols.

To generate the one or more computer-implemented models 132, the training engine 130 may train the one or more computer-implemented models 132. The training engine 130 may use a base training data set including inputs of labeled data (e.g., current, voltage, temperature, rest points on state of charge/open-circuit voltage curve, etc.) mapped to labelled outputs (e.g., state of charge, state of health)

The one or more computer-implemented models 132 may refer to model artifacts created by the training engine 130 using training data that includes training inputs and corresponding target outputs. The training engine 130 may find patterns in the training data wherein such patterns map the training input to the target output and generate the computer-implemented models 132 that capture these patterns. Although depicted separately from the server 128, in some embodiments, the training engine 130 may reside on server 128. Further, in some embodiments, the artificial intelligence engine 140, the database 150, or the training engine 130 may reside on the computing device 102.

As described in more detail below, the one or more computer-implemented models 132 may include machine learning models, neural networks, expert systems (e.g., a single level of linear or non-linear operations (e.g., a support vector machine (SVM) or the computer-implemented models 132 may be a deep network, i.e., a machine learning model comprising multiple levels of non-linear operations). Examples of deep networks are neural networks, including generative adversarial networks, convolutional neural networks, recurrent neural networks with one or more hidden layers, and fully connected neural networks (e.g., each artificial neuron may transmit its output signal to the input of the remaining neurons, as well as to itself). For example, the machine learning model may include numerous layers or hidden layers that perform calculations (e.g., dot products) using various neurons. In some embodiments, the one or more computer-implemented models 132 may be trained via supervised learning, self-supervised, unsupervised learning, and/or reinforcement learning.

Figure 2:
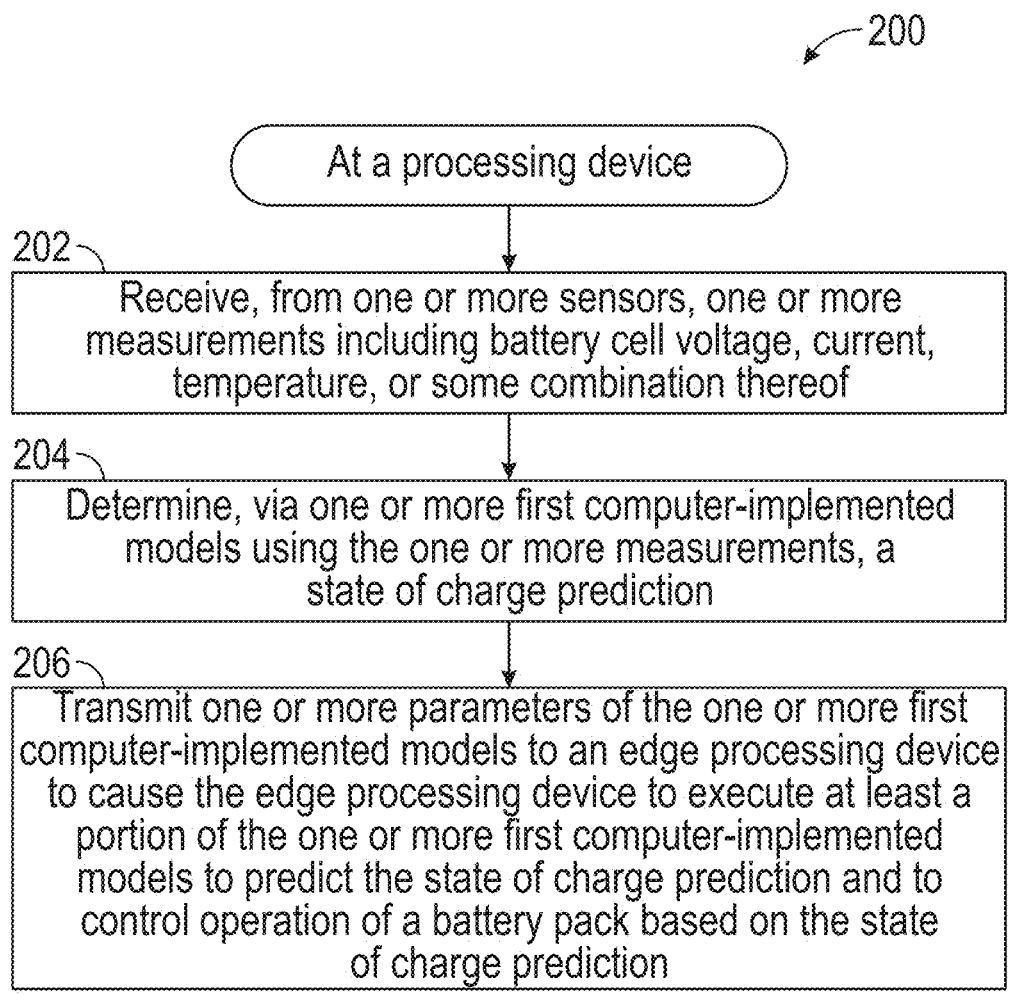
FIG. 2 illustrates example operations of a method for predicting a state of charge of one or more battery cells of a battery pack according to certain embodiments of this disclosure.

FIG. 2 illustrates example operations of a method 200 for predicting a state of charge of one or more battery cells of a battery pack according to certain embodiments of this disclosure. The method 200 is performed by processing logic that may include hardware (circuitry, dedicated logic, etc.), software (such as is run on a computer system or specialized dedicated machine), or a combination of both. The method 200 or each of their individual functions, routines, subroutines, or operations may be performed by one or more processors of a computing device (e.g., any component of FIG. 1, such as computing device 102, server 128, etc.). In certain implementations, the method 200 may be performed by a single processing thread. Alternatively, the method 200 may be performed by two or more processing threads, each thread implementing one or more individual functions, routines, subroutines, or operations of the methods. In some embodiments, one or more accelerators may be used to increase the performance of a processing device by offloading various functions, routines, subroutines, or operations from the processing device.

For simplicity of explanation, the method 200 is depicted and described as a series of operations. However, operations in accordance with this disclosure can occur in various orders or concurrently, and with other operations not presented and described herein. For example, the operations depicted in the method 200 may occur in combination with any other operation of any other method disclosed herein. Furthermore, not all illustrated operations may be required to implement the method 200 in accordance with the disclosed subject matter. In addition, those skilled in the art will understand and appreciate that the method 200 could alternatively be represented as a series of interrelated states via a state diagram or events.

In some embodiments, one or more machine learning models may be generated and trained by the artificial intelligence engine and/or the training engine to perform one or more of the operations of the methods described herein. For example, to perform the one or more operations, the processing device may execute the one or more machine learning models. In some embodiments, the one or more machine learning models may be iteratively retrained to select different features capable of enabling optimization of output. The features that may be modified may include a number of nodes included in each layer of the machine learning models, an objective function executed at each node, a number of layers, various weights associated with outputs of each node, and the like.

In some embodiments, a battery pack may be used to at least partially power a vehicle, a computing device, or both. In some embodiments, one or more sensor measurements may be received before a charging event, during a charging, or after a charging event.

At 202, the processing device may receive, from one or more sensors, one or more measurements including one or more battery cell voltages, battery cell currents, battery cell temperatures, or some combination thereof. The one or more sensors may be one or more current sensors, voltage sensors, temperature sensors, accelerometers, pressure sensors, etc. associated with one or more battery packs. The one or more measurements may be received by an edge processing device and transmitted to the processing device. in some embodiments, the edge processing device may preprocess the one or more measurements by filtering noise from sensor data, extracting features, or some combination thereof to refine the one or more measurements.

At 204, the processing device may determine, via one or more first computer-implemented models using the one or more measurements, a state of charge prediction. The one or more first computer-implemented models may be initially trained to determine a state of charge prediction using a first training dataset including data pertaining to a set of battery cells generated based on at least one of state of charge tests of the set of battery cells, open-circuit voltage tests of the set of battery cells, and drive cycle tests of the set of battery cells.

One or more of the one or more first computer-implemented models may be additionally trained to determine the state of charge prediction using a second training dataset including data pertaining to a target battery cell generated based on at least one of state of charge tests of the target battery cell, open-circuit voltage tests of the target battery cell, and drive cycle tests of the target battery cell. In some embodiments, the second training dataset may include data pertaining to a single target battery chemistry and a single target cell structure. In some embodiments, the state of charge tests may measure voltage across terminals of battery packs including the set of battery cells, the target battery cell, or some combination thereof when they are not connected to any load. In some embodiments the open-circuit voltage tests may measure voltage of battery packs at different state of charge levels under no-load conditions. In some embodiments, the drive cycle tests may simulate real-world driving conditions to evaluate battery performance under dynamic load and varying temperature conditions.

In some embodiments, the first and second training datasets may include the open-circuit voltage tests of the set of battery cells and the target battery cell generated by measuring open-circuit voltage of a fully charged cell and discharging the cell in small increments to lower state of charge, resting for transients to dissipate and measuring open-circuit voltage at each increment and, once fully discharged, charging the cell to a new state of charge level in small increments, resting for transients to dissipate and measuring open-circuit voltage at each increment until the cell is fully charged, and plotting a charging and discharging open-circuit voltage and state of charge graph allowing determination and storing state of charge labels for training.

At 206, the processing device may transmit one or more parameters of the one or more computer-implemented models to an edge processing device to cause the edge processing device to execute at least a portion of the one or more first computer-implemented models to predict the state of charge prediction and to display the state of charge prediction on a user interface and/or control operation of a battery pack based on the state of charge prediction. The edge processing device may receive the one or more parameters from the cloud-based computing system 116 and may update and/or train the portion of the one or more first computer-implemented models that are stored in one or more memory devices of the edge (e.g., vehicle computing device, user computing device, edge computing device, etc.). The one or more first computer-implemented models may be implemented in computer instructions stored on one or more memory devices and executed by one or more processing devices. The one or more first computer-implemented models may be one or more machine learning models, neural networks, expert systems, or the like.

In some embodiments, the edge processing device may determine, using one or more second computer-implemented models, a state of health prediction of the battery pack. The state of health prediction may relate to a degradation of the battery pack. The edge processing device may determine, via the at least the portion of the one or more first computer-implemented models and using the state of health prediction of the battery pack, the state of charge prediction of the battery pack.

In some embodiments, the processing device may, based on the state of charge prediction of the battery pack, control operation of a vehicle, charge one or more battery cells of the batter pack, or both. In some embodiments, controlling operation of the vehicle may include executing one or more control instructions that cause the vehicle control system to change speed, change revolutions per minute, control a drivetrain, control power steering, consume more/less energy, use more/less current, use more/voltage, etc.

In some embodiments, the one or more processing devices may store the first training dataset as diverse data pertaining to a set of battery chemistries and a set of cell patterns. The diverse data may pertain to a battery pack current, a cell voltage, a cell current, a cell temperature, or some combination thereof under a range of temperatures including extremities, varying charging, varying discharging, and varying stress conditions. The diverse data may include first diverse data received from one or more sensors associated with one or more battery packs operating in the field, second diverse data pertaining to the battery packs from lab tests of a manufacturer of the battery packs, third diverse data pertaining to synthetically generated data associated with the battery packs, and fourth diverse data pertaining to a set of battery chemistries and the set of cell patterns' open-circuit voltage during charging and discharging. In some embodiments, the synthetically generated data may be generated using one or more simulated battery usage conditions. The one or more simulated battery usage conditions may include edge cases or rare events. The edge cases or rare events may include stress conditions (e.g., light load, heavy load, temperatures (below 23 degrees Fahrenheit or above 122 degrees Fahrenheit), charging above a maximum state of charge, discharging below a minimum state of charge, etc.).

Further, in some embodiments, the processing device may generate the diverse data by merging the first, second, third, and fourth diverse data for the set of battery chemistries and the set of cell patterns without any gaps in temperature, charging, discharging steps, and stress conditions pertaining to loads from light to heavy loads including extremities.

In some embodiments, the diverse data may be paired and stored with known state of charge labels for supervised learning and stored without any labels for unsupervised learning. The supervised learning may be performed during the initial training of the one or more computer-implemented models. The unsupervised learning may be performed during the additional training of the one or more first computer-implemented models.

Figure 3:
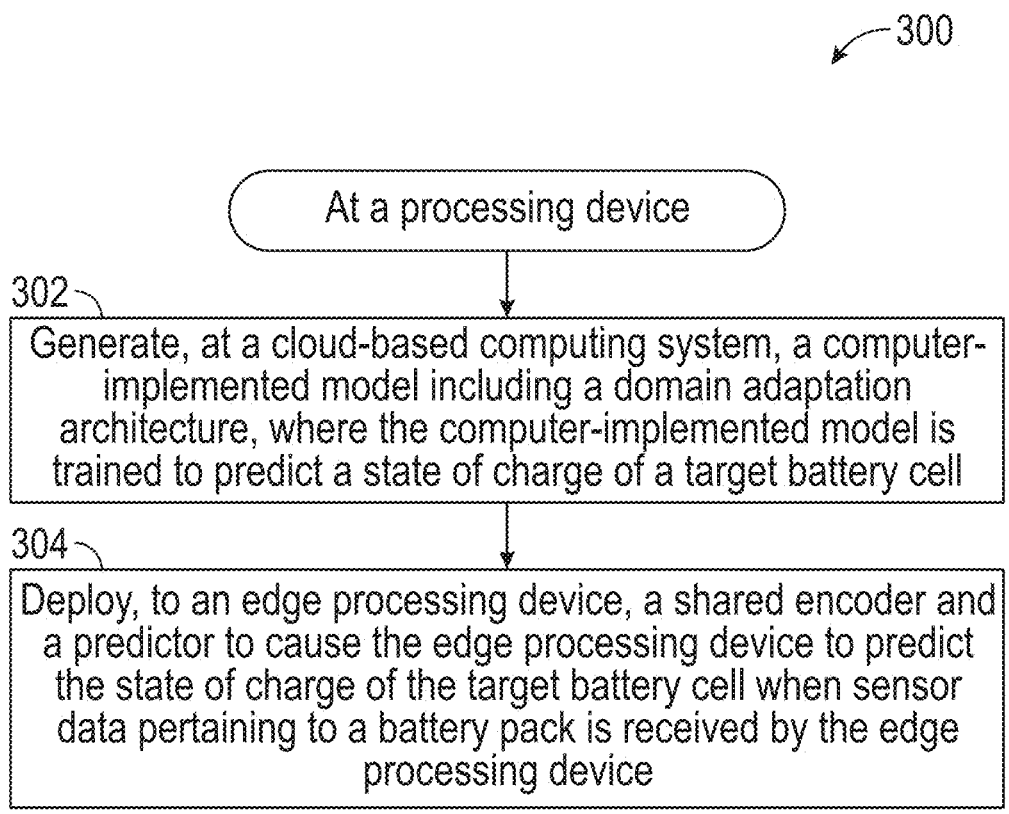
FIG. 3 illustrates example operations of a method for using a domain adaptation architecture to predict a state of charge of one or more battery cells of a battery pack according to certain embodiments of this disclosure.

FIG. 3 illustrates example operations of a method 300 for using a domain adaptation architecture to predict a state of charge of one or more battery cells of a battery pack according to certain embodiments of this disclosure. The method 300 is performed by processing logic that may include hardware (circuitry, dedicated logic, etc.), software (such as is run on a computer system or specialized dedicated machine), or a combination of both. The method 300 or each of their individual functions, routines, subroutines, or operations may be performed by one or more processors of a computing device (e.g., any component of FIG. 1, such as computing device 102, server 128, etc.). In certain implementations, the method 300 may be performed by a single processing thread. Alternatively, the method 300 may be performed by two or more processing threads, each thread implementing one or more individual functions, routines, subroutines, or operations of the methods. In some embodiments, one or more accelerators may be used to increase the performance of a processing device by offloading various functions, routines, subroutines, or operations from the processing device.

For simplicity of explanation, the method 300 is depicted and described as a series of operations. However, operations in accordance with this disclosure can occur in various orders or concurrently, and with other operations not presented and described herein. For example, the operations depicted in the method 300 may occur in combination with any other operation of any other method disclosed herein. Furthermore, not all illustrated operations may be required to implement the method 300 in accordance with the disclosed subject matter. In addition, those skilled in the art will understand and appreciate that the method 300 could alternatively be represented as a series of interrelated states via a state diagram or events.

In some embodiments, one or more machine learning models may be generated and trained by the artificial intelligence engine and/or the training engine to perform one or more of the operations of the methods described herein. For example, to perform the one or more operations, the processing device may execute the one or more machine learning models. In some embodiments, the one or more machine learning models may be iteratively retrained to select different features capable of enabling optimization of output. The features that may be modified may include a number of nodes included in each layer of the machine learning models, an objective function executed at each node, a number of layers, various weights associated with outputs of each node, and the like.

At 302, the processing device may generate, at a cloud-based computing system 116, a computer-implemented model including a domain adaptation architecture. The computer-implemented model may be trained to predict a state of charge of a target battery cell. The domain adaptation architecture may include a first private encoder that is pre-trained using first data pertaining to a set of battery cells in a fleet of vehicle, a shared encoder that is trained using the first data and second data pertaining to a target battery cell, a computer-implemented predictor that is trained to predict the state of charge of the target battery cell using output from the first private encoder and the shared encoder, among other things.

In some embodiments, the domain adaptation architecture may include a second private encoder that is trained using the second data pertaining to the target battery cell, and a decoder that is trained to output at least one auxiliary task prediction based on output from the second private encoder and the shared encoder. In some embodiments, the first private encoder, the second private encoder, the shared encoder, the computer-implemented predictor, and/or the decoder may include one or more machine learning models, neural networks, expert systems, etc. In some embodiments, the first data may include fleet data pertaining to fleet battery cells' temperature, voltage, current, or some combination thereof, and the second data may include target battery cell data pertaining to the target battery cell's temperature, voltage, current, or some combination thereof.

In some embodiments, the processing device may train the computer-implemented predictor using supervised learning with training data labeled indicating a state of charge of a battery cell. In some embodiments, the processing device may train the decoder using self-supervised learning with unlabeled training data.

At 304, the processing device may deploy, to an edge processing device, the shared encoder and the predictor to cause the edge processing device to predict the state of charge of the target battery cell when sensor data pertaining to a battery pack is received by the edge processing device.

In some embodiments, the processing device may receive, at the cloud-based computing system 116, the sensor data. The processing device may determine whether a difference between the at least one auxiliary task prediction and the sensor data satisfy an error threshold. Responsive to determining that the difference satisfies the error threshold, the processing device may retrain the shared encoder. Further, the processing device may redeploy the shared encoder to the edge processing device.

In some embodiments, the first private encoder and the predictor remained unmodified when the shared encoder is retrained. That is, weights and/or parameters used by and associated with the first private encoder and/or the predictor may be frozen in that they are unmodified and their values, settings, configurations, etc. remain the same.

In some embodiments, the one or more processing devices may store the first data as diverse data pertaining to a set of battery chemistries and a set of cell patterns. The diverse data may pertain to a battery pack current, a cell voltage, a cell current, a cell temperature, or some combination thereof under a range of temperatures including extremities, varying charging, varying discharging, and varying stress conditions. The diverse data may include first diverse data received from one or more sensors associated with one or more battery packs operating in the field, second diverse data pertaining to the battery packs from lab tests of a manufacturer of the battery packs, third diverse data pertaining to synthetically generated data associated with the battery packs, and fourth diverse data pertaining to a set of battery chemistries and the set of cell patterns' open-circuit voltage during charging and discharging. In some embodiments, the synthetically generated data may be generated using one or more simulated battery usage conditions. The one or more simulated battery usage conditions may include edge cases or rare events. The edge cases or rare events may include stress conditions (e.g., light load, heavy load, temperatures (below 23 degrees Fahrenheit or above 122 degrees Fahrenheit), charging above a maximum state of charge, discharging below a minimum state of charge, etc.).

Further, in some embodiments, the processing device may generate the diverse data by merging the first, second, third, and fourth diverse data for the set of battery chemistries and the set of cell patterns without any gaps in temperature, charging, discharging steps, and stress conditions pertaining to loads from light to heavy loads including extremities.

In some embodiments, the diverse data may be paired and stored with known state of charge labels for supervised learning and stored without any labels for unsupervised learning.

In some embodiments, the second data may include data pertaining to a single target battery chemistry and a single target cell structure. In some embodiments, the first and second data may include the open-circuit voltage tests of the set of battery cells and target battery cell generated by measuring open-circuit voltage of a fully charged cell and discharging the cell in small increments to lower state of charge, resting for transients to dissipate and measuring open-circuit voltage at each increment and, once fully discharged, charging the cell to a new state of charge level in small increments, resting for transients to dissipate and measuring open-circuit voltage at each increment until the cell is fully charged and plotting a charging and discharging open-circuit voltage and state of charge graph allowing determination and storing state of charge labels for training of the one or more computer-implemented models.

Figure 4:
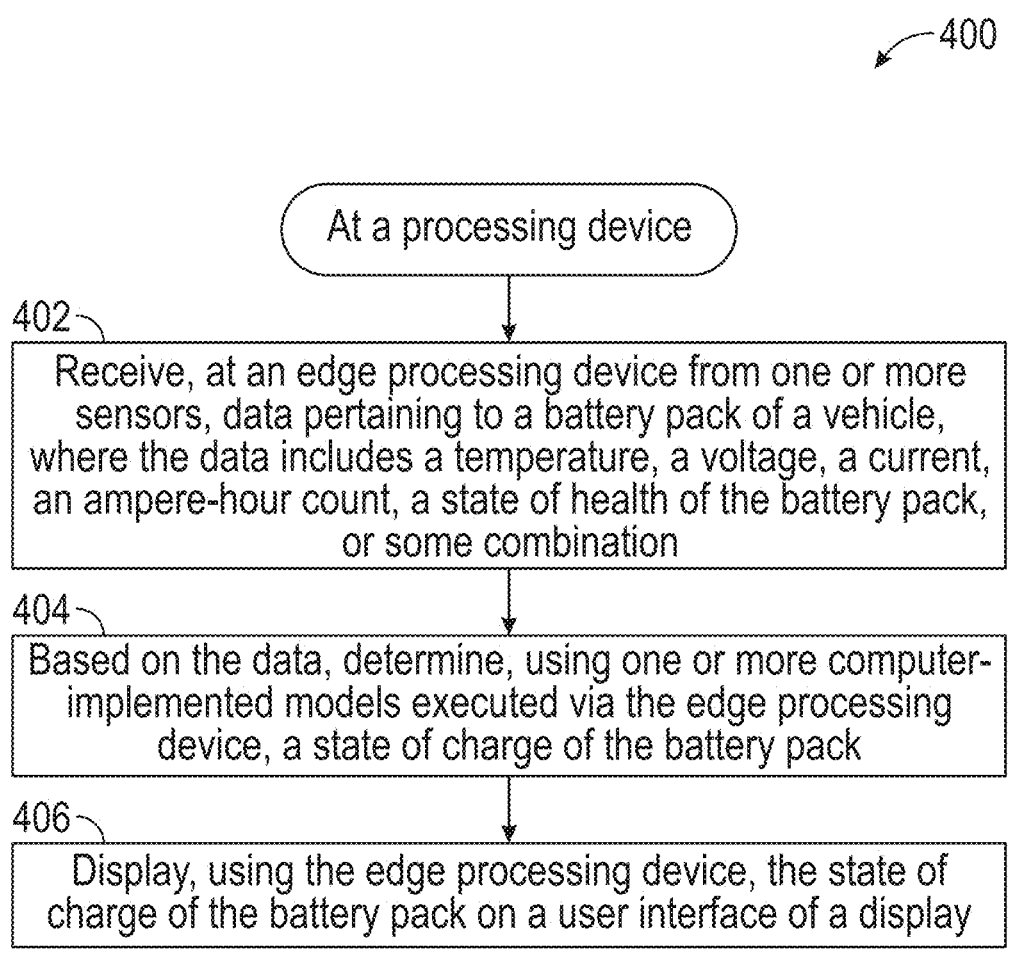
FIG. 4 illustrates example operations of a method for using at least two components deployed to an edge processing device to predict a state of charge of one or more battery cells of a battery pack according to certain embodiments of this disclosure.

FIG. 4 illustrates example operations of a method 400 for using at least two components deployed to an edge processing device to predict a state of charge of one or more battery cells of a battery pack according to certain embodiments of this disclosure. The method 400 is performed by processing logic that may include hardware (circuitry, dedicated logic, etc.), software (such as is run on a computer system or specialized dedicated machine), or a combination of both. The method 400 or each of their individual functions, routines, subroutines, or operations may be performed by one or more processors of a computing device (e.g., any component of FIG. 1, such as computing device 102, server 128, etc.). In certain implementations, the method 400 may be performed by a single processing thread. Alternatively, the method 200 may be performed by two or more processing threads, each thread implementing one or more individual functions, routines, subroutines, or operations of the methods. In some embodiments, one or more accelerators may be used to increase the performance of a processing device by offloading various functions, routines, subroutines, or operations from the processing device.

For simplicity of explanation, the method 400 is depicted and described as a series of operations. However, operations in accordance with this disclosure can occur in various orders or concurrently, and with other operations not presented and described herein. For example, the operations depicted in the method 400 may occur in combination with any other operation of any other method disclosed herein. Furthermore, not all illustrated operations may be required to implement the method 400 in accordance with the disclosed subject matter. In addition, those skilled in the art will understand and appreciate that the method 400 could alternatively be represented as a series of interrelated states via a state diagram or events.

In some embodiments, one or more machine learning models may be generated and trained by the artificial intelligence engine and/or the training engine to perform one or more of the operations of the methods described herein. For example, to perform the one or more operations, the processing device may execute the one or more machine learning models. In some embodiments, the one or more machine learning models may be iteratively retrained to select different features capable of enabling optimization of output. The features that may be modified may include a number of nodes included in each layer of the machine learning models, an objective function executed at each node, a number of layers, various weights associated with outputs of each node, and the like.

At 402, an edge processing device may receive, from one or more sensors, data pertaining to a battery pack of a vehicle. The data may include one or more temperatures, voltages, currents, Ampere-hour count, states of health of the battery pack, or some combination thereof. In some embodiments, the edge processing device may execute instructions that filter the data to remove noise from the data.

At 404, the edge processing device may, based on the data, determine, using one or more computer-implemented models executed by edge processing device, a state of charge of the battery pack. The one or more computer-implemented models may include (i) a first component trained to process the data to generate processed data and (ii) a second component trained to use the processed data to predict the state of charge of the battery pack.

In some embodiments, the first component may be trained at a cloud-based computing system 116 using first data pertaining to a target battery cell included in the battery pack and second data pertaining to a set of battery cells included in a fleet of battery packs, and the second component may be trained using the second data pertaining to the set of battery cells included in the fleet of battery packs.

In some embodiments, the edge processing device may receive, from a cloud-based computing system 116, one or more parameters of the one or more computer-implemented models, and configure, using the one or more parameters, the one or more computer-implemented models. Configuring the one or computer-implemented models may include training the models using training data with set values and/or weights for the parameters, and the like. In some embodiments, the one or more computer-implemented models may include machine learning models, neural networks, expert systems, and the like.

In some embodiments, the first component may include a shared encoder implemented by a first machine learning model and the second component may include a predictor implemented by a second machine learning model. The shared encoder and the predictor may be implemented in computer instructions stored on one or more memory device and executed by one or more processing devices. The shared encoder and the predictor may be one or more computer-implemented models such as machine learning models, neural networks, expert systems, etc.

At 406, the processing device may display, using the edge processing device, the state of charge of the battery pack on a user interface of a display.

In some embodiments, the edge processing device may control, based on the state of charge of the battery pack, operation of the vehicle, charging of the battery pack, or both. In some embodiments, the edge processing device may generate one or more control instructions, receive one or more control instructions, or both and execute the control instructions to cause operation of the vehicle to modify (e.g., change speed, control a driveshaft, control a drivetrain, control a power steering system, control an air conditioning system, control one or more electrical components within the vehicle, etc.) and/or the charging of the battery to modify and/or operation of the battery to modify (e.g., turn on/off, consume more/less current, consume more/less voltage, etc.).

In some embodiments, the edge processing device may transmit, using one or more network interfaces to a cloud-based computing system 116, the data and the state of charge of the battery pack. The cloud-based computing system 116 may be configured to determine whether the data differs from predicted auxiliary task values by a threshold error. Responsive to determining that the data differs from the predicted auxiliary task values by the threshold error, the cloud-based computing system 116 may be configured to retrain, using fleet data, the first component while leaving the second component unmodified. In some embodiments, the cloud-based computing system 116 may be configured to redeploy the first component to the edge processing device.

In some embodiments, the cloud-based computing system 116 may store the second data as diverse data pertaining to a set of battery chemistries and a set of cell patterns. The diverse data may pertain to a battery pack current, a cell voltage, a cell current, a cell temperature, or some combination thereof under a range of temperatures including extremities, varying charging, varying discharging, and varying stress conditions. The diverse data may include first diverse data received from one or more sensors associated with one or more battery packs operating in the field, second diverse data pertaining to the battery packs from lab tests of a manufacturer of the battery packs, third diverse data pertaining to synthetically generated data associated with the battery packs, and fourth diverse data pertaining to a set of battery chemistries and the set of cell patterns' open-circuit voltage during charging and discharging. In some embodiments, the synthetically generated data may be generated using one or more simulated battery usage conditions. The one or more simulated battery usage conditions may include edge cases or rare events. The edge cases or rare events may include stress conditions (e.g., light load, heavy load, temperatures (below 23 degrees Fahrenheit or above 122 degrees Fahrenheit), charging above a maximum state of charge, discharging below a minimum state of charge, etc.).

Further, in some embodiments, the processing device may generate the diverse data by merging the first, second, third, and fourth diverse data for the set of battery chemistries and the set of cell patterns without any gaps in temperature, charging, discharging steps, and stress conditions pertaining to loads from light to heavy loads including extremities.

In some embodiments, the diverse data may be paired and stored with known state of charge labels for supervised learning and stored without any labels for unsupervised learning.

In some embodiments, the first data may include data pertaining to a single target battery chemistry and a single target cell structure. In some embodiments, the first and second data may include the open-circuit voltage tests of the set of battery cells and target battery cell generated by measuring open-circuit voltage of a fully charged cell and discharging the cell in small increments to lower state of charge, resting for transients to dissipate and measuring open-circuit voltage at each increment and, once fully discharged, charging the cell to a new state of charge level in small increments, resting for transients to dissipate and measuring open-circuit voltage at each increment until the cell is fully charged and plotting a charging and discharging open-circuit voltage and state of charge graph allowing determination and storing state of charge labels for training of the one or more computer-implemented models.

Figure 5:
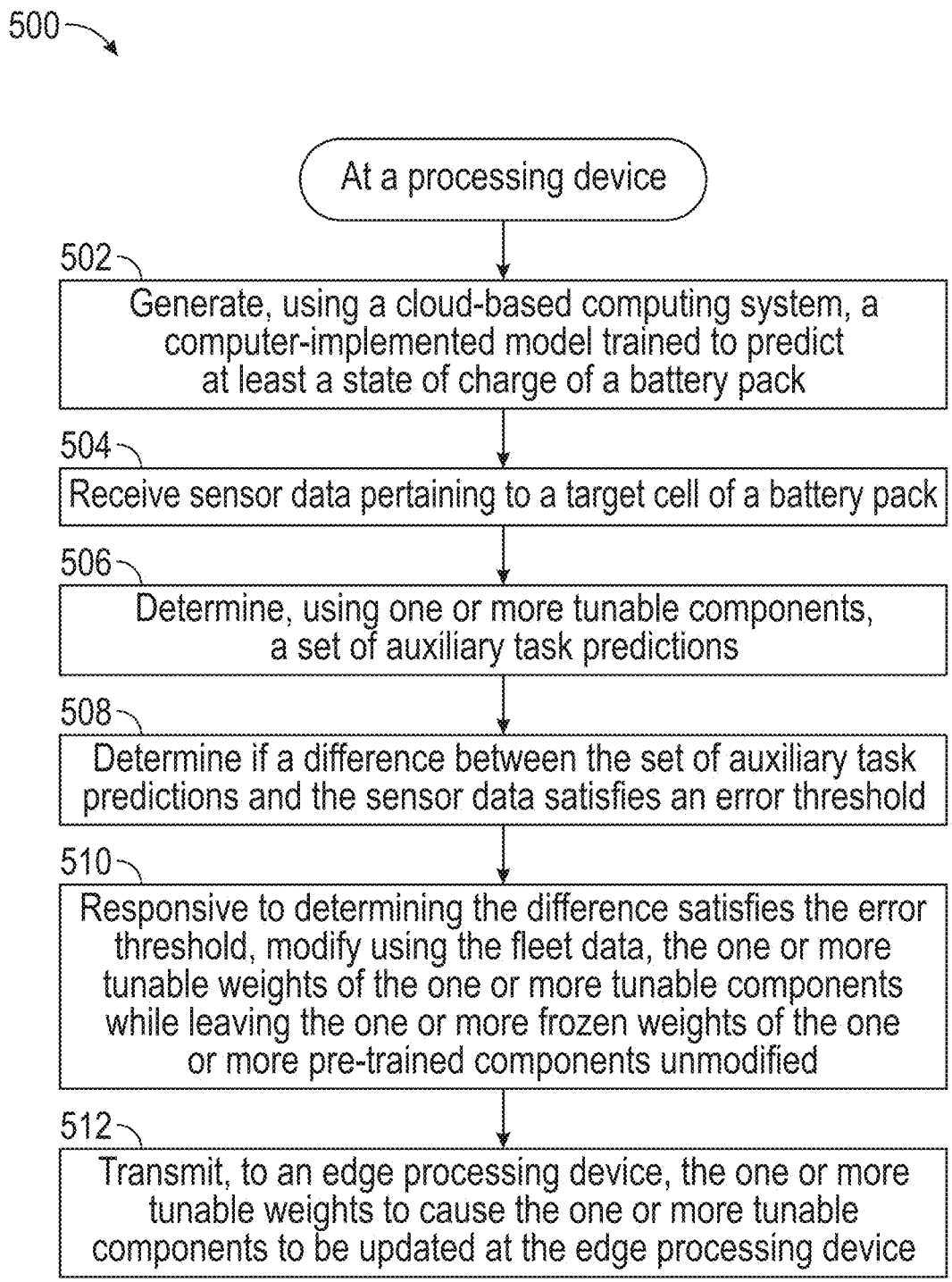
FIG. 5 illustrates example operations of a method for determining whether auxiliary tasks satisfy a threshold and retraining only tunable components of a computer-implemented model using fleet data according to certain embodiments of this disclosure.

FIG. 5 illustrates example operations of a method 500 for determining whether auxiliary tasks satisfy a threshold and retraining only tunable components of a computer-implemented model using fleet data according to certain embodiments of this disclosure. The method 500 is performed by processing logic that may include hardware (circuitry, dedicated logic, etc.), software (such as is run on a computer system or specialized dedicated machine), or a combination of both. The method 500 or each of their individual functions, routines, subroutines, or operations may be performed by one or more processors of a computing device (e.g., any component of FIG. 1, such as computing device 102, server 128, etc.). In certain implementations, the method 500 may be performed by a single processing thread. Alternatively, the method 500 may be performed by two or more processing threads, each thread implementing one or more individual functions, routines, subroutines, or operations of the methods. In some embodiments, one or more accelerators may be used to increase the performance of a processing device by offloading various functions, routines, subroutines, or operations from the processing device.

For simplicity of explanation, the method 500 is depicted and described as a series of operations. However, operations in accordance with this disclosure can occur in various orders or concurrently, and with other operations not presented and described herein. For example, the operations depicted in the method 500 may occur in combination with any other operation of any other method disclosed herein. Furthermore, not all illustrated operations may be required to implement the method 500 in accordance with the disclosed subject matter. In addition, those skilled in the art will understand and appreciate that the method 500 could alternatively be represented as a series of interrelated states via a state diagram or events.

In some embodiments, one or more machine learning models may be generated and trained by the artificial intelligence engine and/or the training engine to perform one or more of the operations of the methods described herein. For example, to perform the one or more operations, the processing device may execute the one or more machine learning models. In some embodiments, the one or more machine learning models may be iteratively retrained to select different features capable of enabling optimization of output. The features that may be modified may include a number of nodes included in each layer of the machine learning models, an objective function executed at each node, a number of layers, various weights associated with outputs of each node, and the like.

At 502, the method 500 may include generating, using the cloud-based computing system 116, a computer-implemented model trained to predict at least a state of charge of a battery pack. The computer-implemented model may include one or more pre-trained components including one or more frozen weights and one or more tunable components including one or more tunable weights. In some embodiments, at least some of the one or more pre-trained components may include one or more machine learning models trained using supervised learning and a training dataset including labeled state of charge data.

At 504, the processing device may receive sensor data pertaining to a target battery cell of a battery pack. The sensor data may include one or more measurements pertaining to voltage, current, temperature, or some combination thereof.

At 506, the processing device may determine, using the one or more tunable components, a set of auxiliary task predictions.

At 508, the processing device may determine if a difference between the set of auxiliary task predictions and the sensor data satisfies an error threshold. In some embodiments, the difference may be determined using a mean square error, a mean absolute error, or both.

At 510, responsive to determining the difference satisfies the error threshold, the processing device may modify, using fleet data, the one or more tunable weights of the one or more tunable components while leaving the one or more frozen weights of the one or more pre-trained components unmodified.

At 512, the processing device may transmit, to an edge processing device, the one or more tunable weights to cause the one or more tunable components to be updated at the edge processing device.

In some embodiments, the edge processing device may execute at least one of the one or more tunable components and at least one of the one or more pre-trained components to predict at least the state of charge of the battery pack. In some embodiments, the at least one of the one or more tunable components includes a shared encoder and the at least one of the one or more pre-trained components includes a predictor. In some embodiments, one or more of the tunable components and/or pre-trained components may be implemented in computer instructions stored on one or more memory devices and executed by one or more processing devices. In some embodiments, the one or more components may include one or more computer-implemented models such as machine learning models, neural networks, expert systems, etc. In some embodiments, the computer-implemented models may be trained using supervised learning, self-supervised learning, reinforcement learning, unsupervised learning, or some combination thereof. In some embodiments, the edge processing device may predict the state of charge of the battery pack in real-time or near real-time as subsequent sensor data is received without contacting the cloud-based computing system.

In some embodiments, the pre-trained components may include one or more machine learning models trained using supervised learning and a training dataset stored as diverse data pertaining to a set of battery chemistries and a set of cell patterns. The diverse data may pertain to a battery pack current, a cell voltage, a cell current, a cell temperature, or some combination thereof under a range of temperatures including extremities, varying charging, varying discharging, and varying stress conditions. The diverse data may include first diverse data received from one or more sensors associated with one or more battery packs operating in the field, second diverse data pertaining to the battery packs from lab tests of a manufacturer of the battery packs, third diverse data pertaining to synthetically generated data associated with the battery packs, and fourth diverse data pertaining to a set of battery chemistries and the set of cell patterns' open-circuit voltage during charging and discharging. In some embodiments, the synthetically generated data may be generated using one or more simulated battery usage conditions. The one or more simulated battery usage conditions may include edge cases or rare events. The edge cases or rare events may include stress conditions (e.g., light load, heavy load, temperatures (below 23 degrees Fahrenheit or above 122 degrees Fahrenheit), charging above a maximum state of charge, discharging below a minimum state of charge, etc.).

Further, in some embodiments, the processing device may generate the diverse data by merging the first, second, third, and fourth diverse data for the set of battery chemistries and the set of cell patterns without any gaps in temperature, charging, discharging steps, and stress conditions pertaining to loads from light to heavy loads including extremities.

In some embodiments, the diverse data may be paired and stored with known state of charge labels for supervised learning and stored without any labels for unsupervised learning. The supervised learning may be performed during initial training of the one or more pre-trained components.

Figure 6:
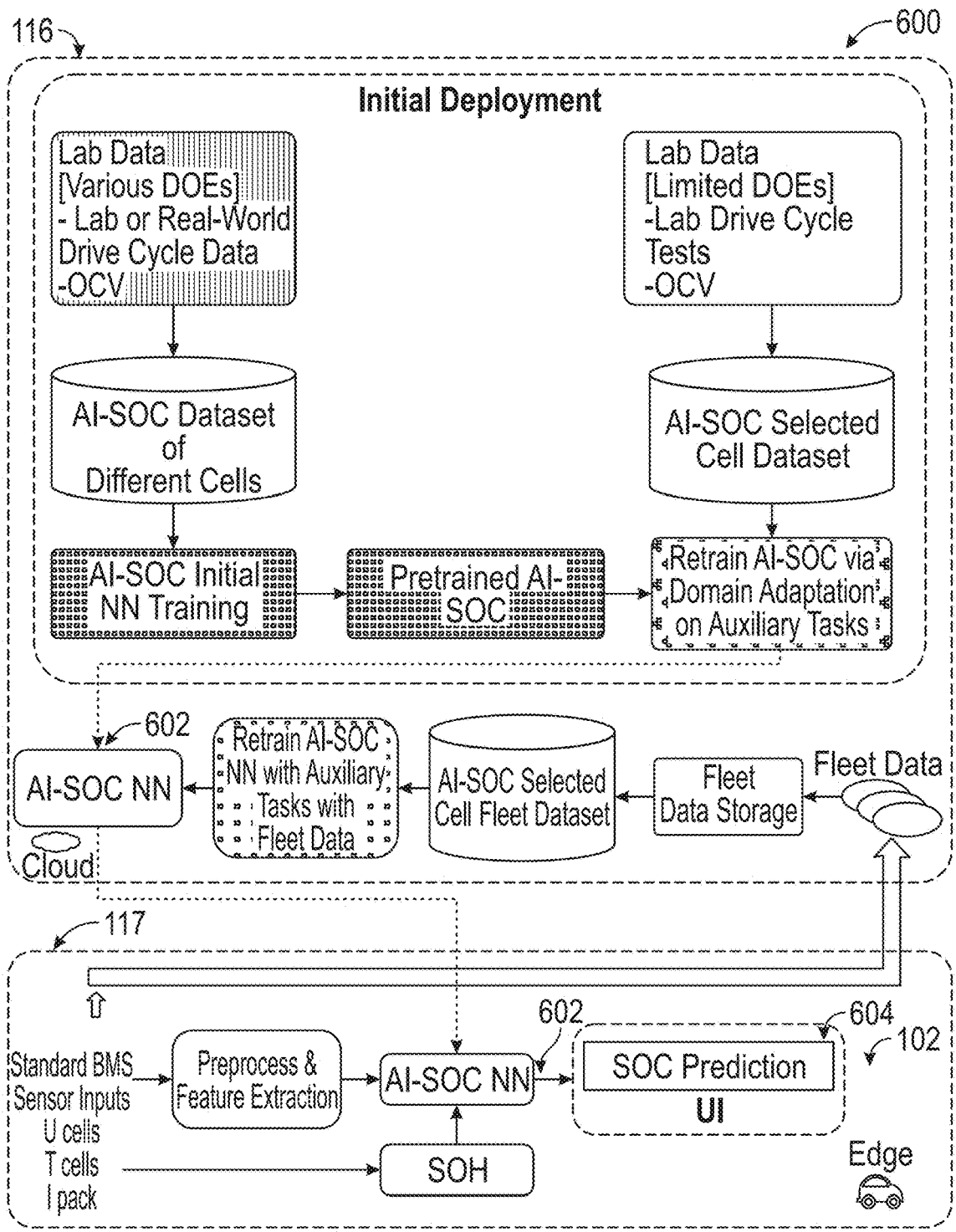
FIG. 6 illustrates an example conceptual block diagram for determining a state of charge of a battery pack at a cloud-based computing system based on data received from a vehicle according to certain embodiments of this disclosure.

FIG. 6 illustrates an example detailed block diagram 600 for determining a state of charge of a battery pack at a cloud-based computing system 116 based on data received from a vehicle 117 according to certain embodiments of this disclosure. In particular, the vehicle 117 may use computing device 102 to transmit data between the vehicle 117 and the cloud-based computing system 116 via a network 112. FIG.

7 illustrates an flow diagram 700 of initial deployment activities according to certain embodiments of this disclosure.

The diagram 600 includes various computer-implemented models such as an artificial intelligent state of charge neural network (AI-SOC NN 602) that is trained to determine a state of charge prediction. The state of charge prediction may be presented on a user interface 604 of a computing device 102 associated with the vehicle 117 or a user.

For the initial deployment, the AI-SOC NN 602 may be initially trained on datasets from various battery cells, creating a broadly pre-trained computer-implemented model and/or pre-trained components. This pre-training stage may enable the AI-SOC NN 602 to learn and distinguish general patterns across different battery cell types, thereby enhancing its adaptability.

Following this, the AI-SOC NN 602 may be fine-tuned using datasets specific to a targeted battery cell. This fine-tuning phase tailors the AI-SOC NN 602 to the unique characteristics of the target cells, refining its accuracy and reliability for the specific application. By combining broad pre-training with targeted fine-tuning, the AI-SOC NN 602 may achieve a balance between generalization and precision, making it robust and highly applicable to real-life scenarios.

By using this approach, the AI-SOC NN 602 may be initially pre-trained on data from a variety of battery cells and design of experiments and then fine-tuned with data specific to a targeted cell. This process may enable the AI-SOC NN 602 to handle a broader range of drive cycles and operating conditions, making it more robust for real-life applications and potentially enabling a higher level of accuracy right from the initial deployment. High intensity training using large datasets may not be performed at the edge and therefore reduces the amount of processing resources consumed by the edge processing device. Instead, only a few components of multiple components of the AI-SOC NN 602 are executed at the edge processing device.

In some embodiments, the sheer amount of data and processing cannot possibly be performed in the human mind due to the complexity, scale, and number of operations. Further, a human mind cannot receive digital data received by a number sensors and transmitted over a wireless network.

Figure 7:
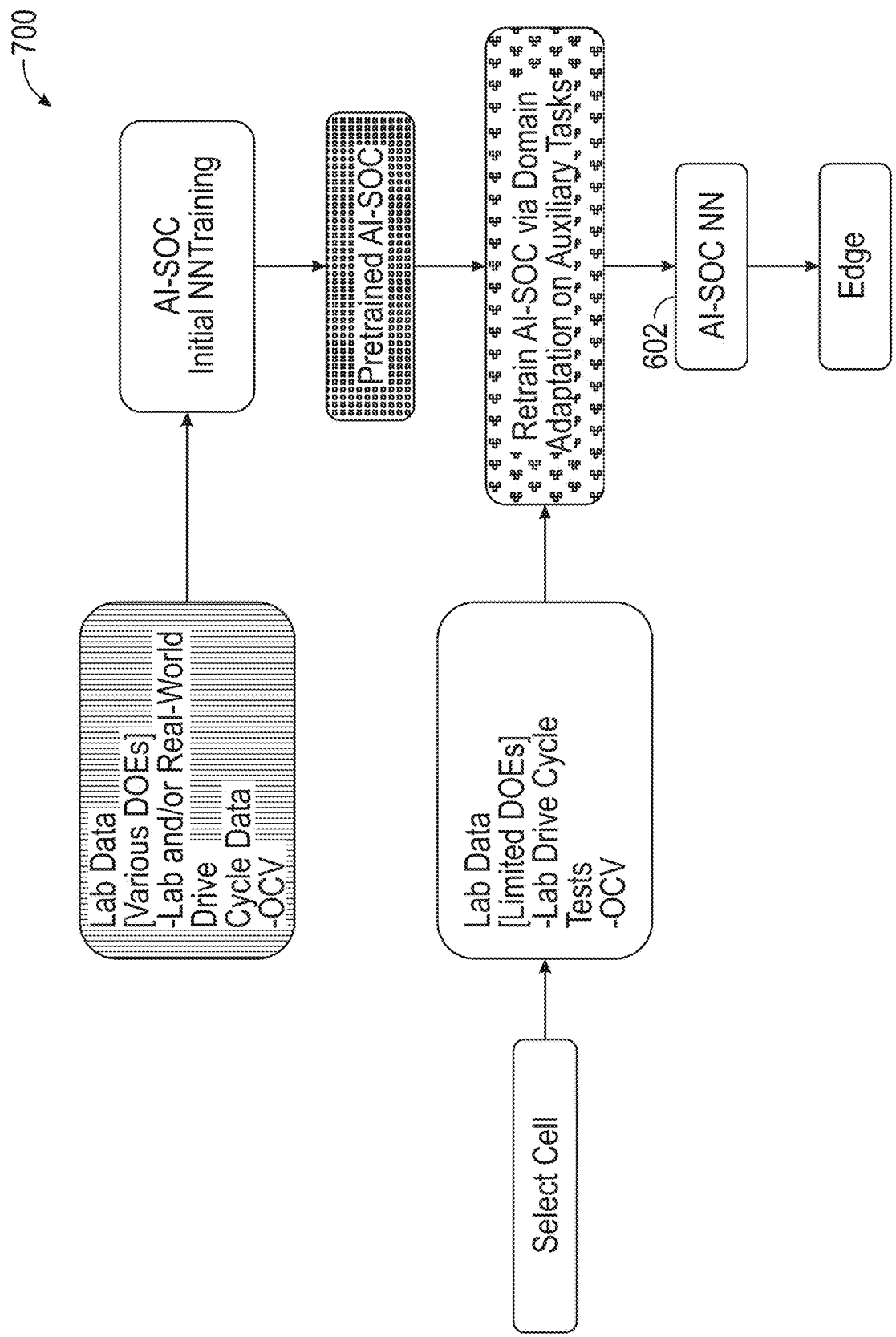
FIG. 7 illustrates an flow diagram of initial deployment activities according to certain embodiments of this disclosure.

In the pre-deployment phase, one or more computer-implemented models 132 undergo initial training using a training dataset composed of diverse battery cells, as shown in FIG. 7.

The diverse dataset may be gathered from laboratory tests specifically designed to observe battery cell performance under controlled conditions. Although these tests may incorporate a large range of scenarios, covering every possible condition the cell might encounter in real-world usage remains challenging. Accordingly, synthetic data generation may be performed by the cloud-based computing system 116. The cloud-based computing system 116 may improve the one or more computer-implemented models 132 (AI-SOC NN 602) robustness by generating additional data that simulates a variety of potential conditions. This synthetic data can be tailored to represent edge cases or rare events that may not be sufficiently captured in the real test data received via one or more sensors, ensuring that the model is better prepared for diverse operational scenarios. Rare events, typically are stress conditions: light load, heavy load, temperatures: below −5C (23F) or above +50C (122F), charging above maximum SOC, discharging below minimum SOC, and the like. The diverse dataset may be obtained from different battery chemistries using different anode, cathode materials, and/or different SEI materials. Further, the diverse dataset including laboratory test data may be supplemented by the synthetic data, creating a full dataset without leaving any gaps between temperature steps and/or rare conditions. The merged diverse dataset may be used by the AI engine 140 to train the one or more computer-implemented models 132 to learn about diverse conditions. The diverse dataset enables the development of a pre-trained computer-implemented model 132 that captures fundamental patterns and behaviors across various battery cells, creating a solid foundation for further adaptation.

The pre-trained computer-implemented model (e.g., AI-SOC NN 602) effectively learns fundamental patterns and behaviors that are common across various battery cells. By training on this diverse dataset, it gains a broad understanding of general cell dynamics, such as response to different charge-discharge cycles, temperature variations, and stress conditions. This foundational knowledge equips the AI-SOC NN 602 to make baseline predictions across a wide range of scenarios.

Since the pre-training diverse dataset cannot capture unique characteristic specific to a target cell, the one or more computer-implemented models 132 undergoes a fine-tuning phase. This targeted adaptation tailors the one or more computer-implemented models 132 to the unique characteristics of the selected targeted battery cell, enhancing its accuracy and robustness under practical deployment conditions for the targeted battery cell.

In the retraining/fine-tuning phase, the one or more computer-implemented models 132 undergoes training using a selected dataset specific to the targeted battery cell. The targeted battery cell dataset may consist of data collected from laboratory tests on the targeted battery cell intended for vehicle deployment. This dataset may include data from the specific battery chosen for deployment. Based on deployment requirements, companies may select batteries based on their chemistry—the chemical composition of the battery, such as Nickel Manganese Cobalt (NMC) or Lithium Iron Phosphate (LIP)—or on capacity requirements to ensure the battery size meets performance needs.

This initial training phase may accelerate time-to-market. By using one or more pre-trained computer-implemented model 132 developed from a wide-ranging dataset, the need for extensive testing on the targeted cell may be minimized. The one or more computer-implemented models 132 can quickly be fine-tuned with the targeted cell's test data, allowing for faster adaptation and deployment and reducing computational complexity/saving computing resources.

Figure 8:
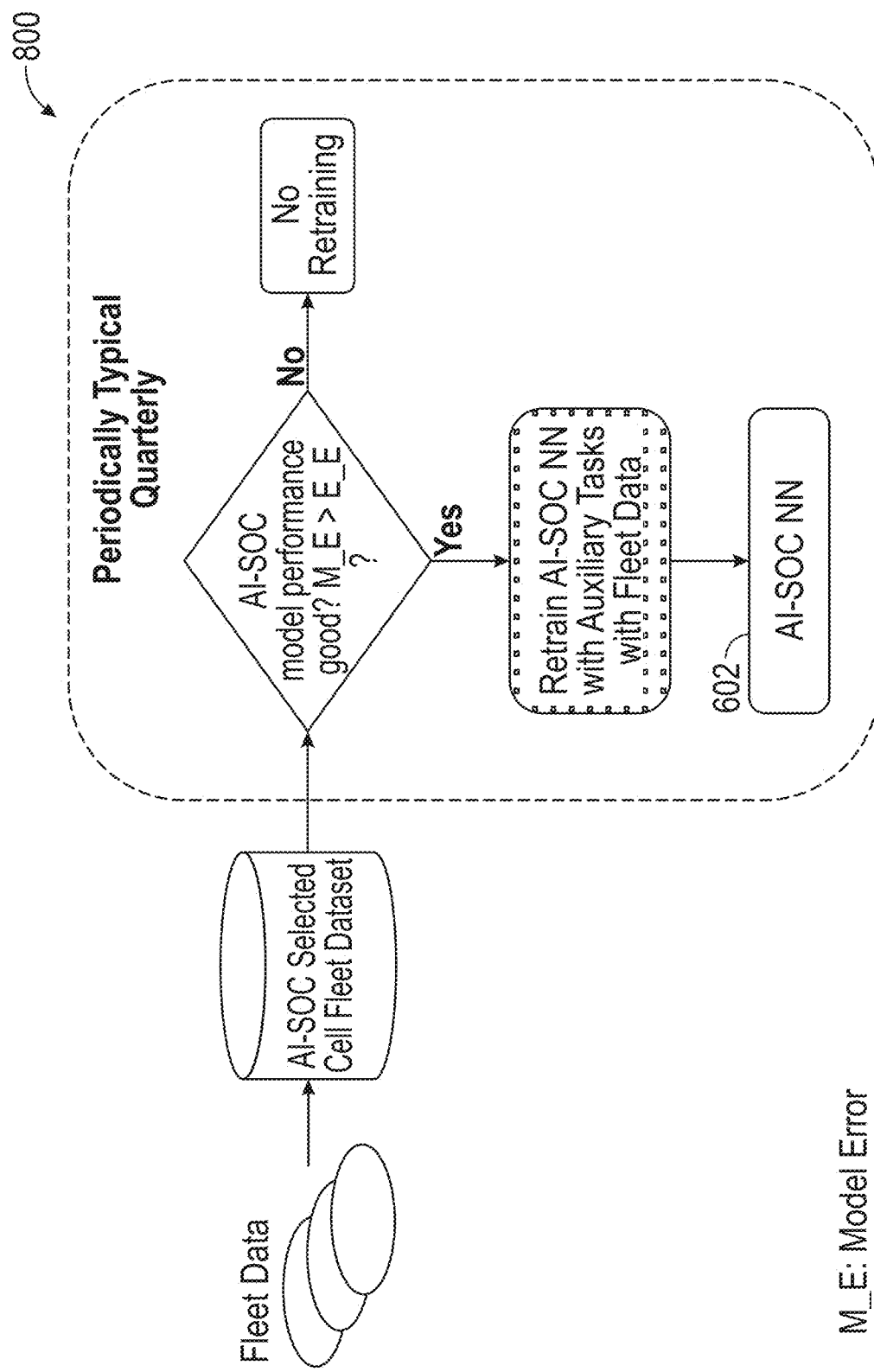
FIG. 8 illustrates an example block diagram for continuous learning according to certain embodiments of this disclosure.

FIG. 8 illustrates an example block diagram 800 for continuous learning according to certain embodiments of this disclosure. Once deployed, the AI-SOC NN 602 may be executed by one or more edge processing devices on edge devices, continuously gathering data. This data may be transmitted to the cloud-based computing system 116, where it is stored in a dataset (e.g., as a training dataset).

On a periodic basis, the performance of the AI-SOC NN 602 may be assessed by comparing auxiliary task predictions with the data stored in the cloud-based computing system's 116 database 150. Since state of charge may lack direct labels or ground truth data, the retraining process may focus exclusively on auxiliary tasks, leveraging their accuracy to refine the model. If the model's performance falls below a threshold accuracy level, then retraining or fine-tuning one or more tunable components of the AI-SOC NN 602 may be initiated using fleet data stored in the database 150. Otherwise, no retraining is necessary. This approach may ensure that the AI-SOC NN 602 is fine-tuned periodically, supporting continuous learning and adaptation to changing conditions.

As depicted in block diagrams 600 and 700, the AI-SOC NN 602 is prepared for deployment by training and retraining it using two different training datasets. An initial training dataset includes a diverse dataset of a set of different battery cells (pre-training dataset). The pre-training dataset may introduce the AI-SOC NN 602 to a range of battery cell patterns and behaviors, which may establish a general understanding across diverse cell types. This dataset may include labeled inputs of voltages, currents, temperatures, etc. mapped to labeled outputs of states of charges for the set of battery packs and/or battery cells. In some embodiments, this technique may develop a strong foundational model with broad knowledge of battery characteristics. This initial pre-training phase may equip the model to handle diverse inputs and prepares it for targeted fine-tuning.

A second training dataset may include a targeted battery cell dataset (domain adaptation dataset). This dataset may be used to fine-tune the AI-SOC NN 602 with specific data from the target battery cell, adapting it to the unique conditions and performance characteristics of that cell. This technique may tailor the AI-SOC NN 602 to achieve high accuracy for the selected cell by adapting it to cell-specific data. This targeted adaptation may improve the model's reliability and performance under real-world conditions specific to the intended application.

Both the pre-training dataset (depicted as AI-SOC Dataset of Different Cells in FIGS. 6, 13, and 14) and the domain adaptation dataset (depicted as AI-SOC Selected Cell Dataset in the FIGS. 6, 14, and 16) may include the following types of tests: SOC/OCV (state of charge/open-circuit voltage) and drive cycle.

Figure 9:
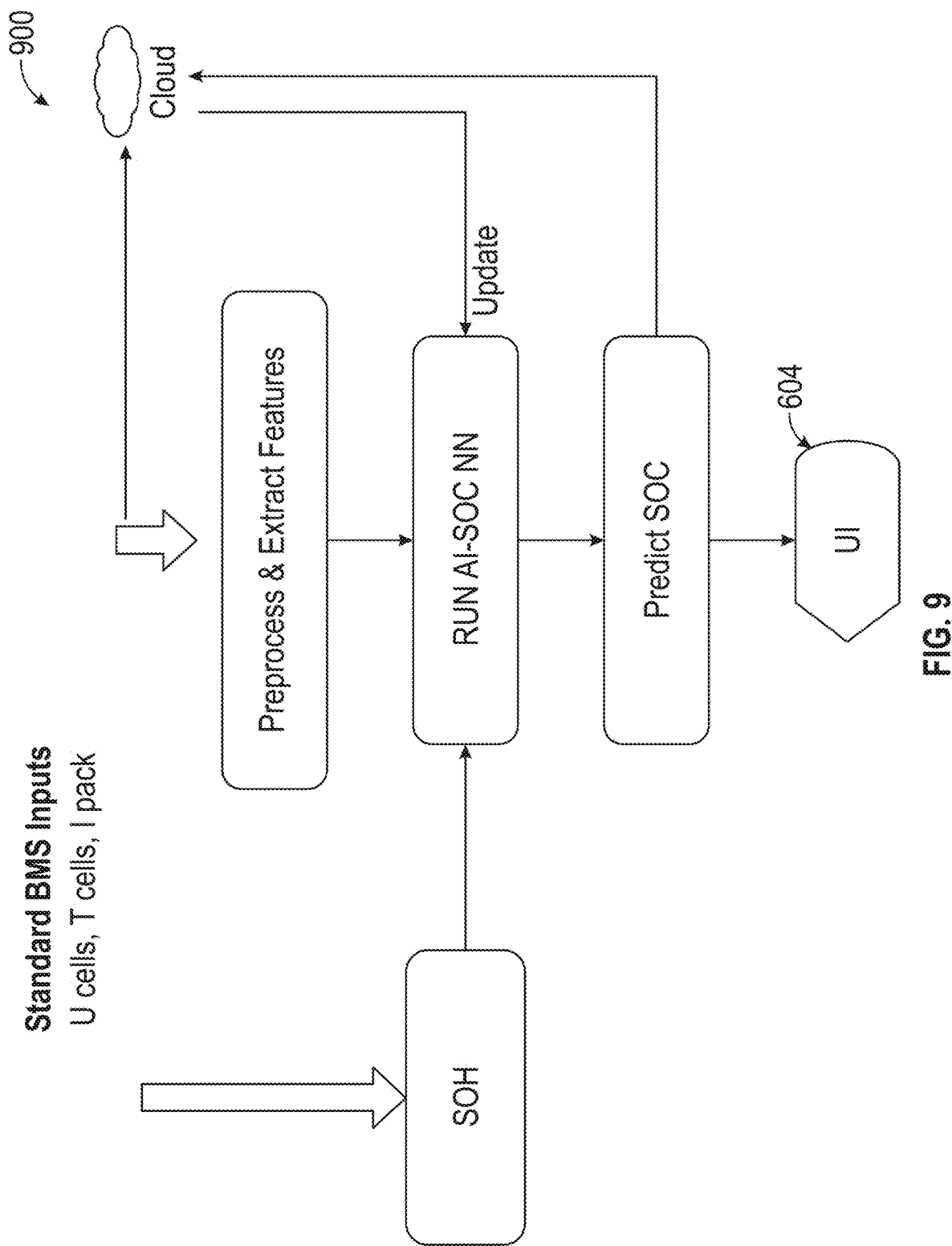
FIG. 9 illustrates an example block diagram predicting a state of charge using one or more computer-implemented models executed at an edge processing device according to certain embodiments of this disclosure.

FIG. 9 illustrates an example block diagram 900 predicting a state of charge using one or more computer-implemented models executed at an edge processing device according to certain embodiments of this disclosure. In some embodiments, sensor data, including battery cell voltage, current, and temperature, may be collected on edge devices as standard battery management inputs. The edge processing device may preprocess the sensor data by performing noise filtering and feature extraction to refine the input data, ensuring higher quality and reliability. The AI-SOC NN 602 may then processes this filtered data to predict the battery pack and/or battery cells' state of charge level, which is displayed to users on the user interface 604.

State of health (SOH) is also utilized as a feature in the AI-SOC NN 602 to enhance its predictive accuracy. The SOH value is generated by one or more computer-implemented models (e.g., an SOH model), which predicts the battery's health based on sensor data such as voltage, current, and temperature as depicted in the block diagram 900. Incorporating SOH as a feature allows the AI-SOC NN 602 to account for battery degradation, improving the AI-SOC NN's 602 reliability and performance over time.

The sensor data and the AI-SOC NN's 602 predictions are sent to the cloud-based computing system 116 continuously, continually, periodically, or the like. This process may ensure that fleet data is consistently transmitted to the cloud-based computing system 116, thereby supporting continuous learning and computer-implemented model improvement.

In some embodiments, the AI-SOC NN's 602 parameters are updated from the cloud-based computing system 116 periodically, continuously, continually, or the like. These updates may occur when predicted values across the fleet diverges from average ground truth of auxiliary tasks. Such continuous learning may continuously enhance the accuracy of the AI-SOC NN with the benefit of retraining using real-world fleet data.

Figure 10:
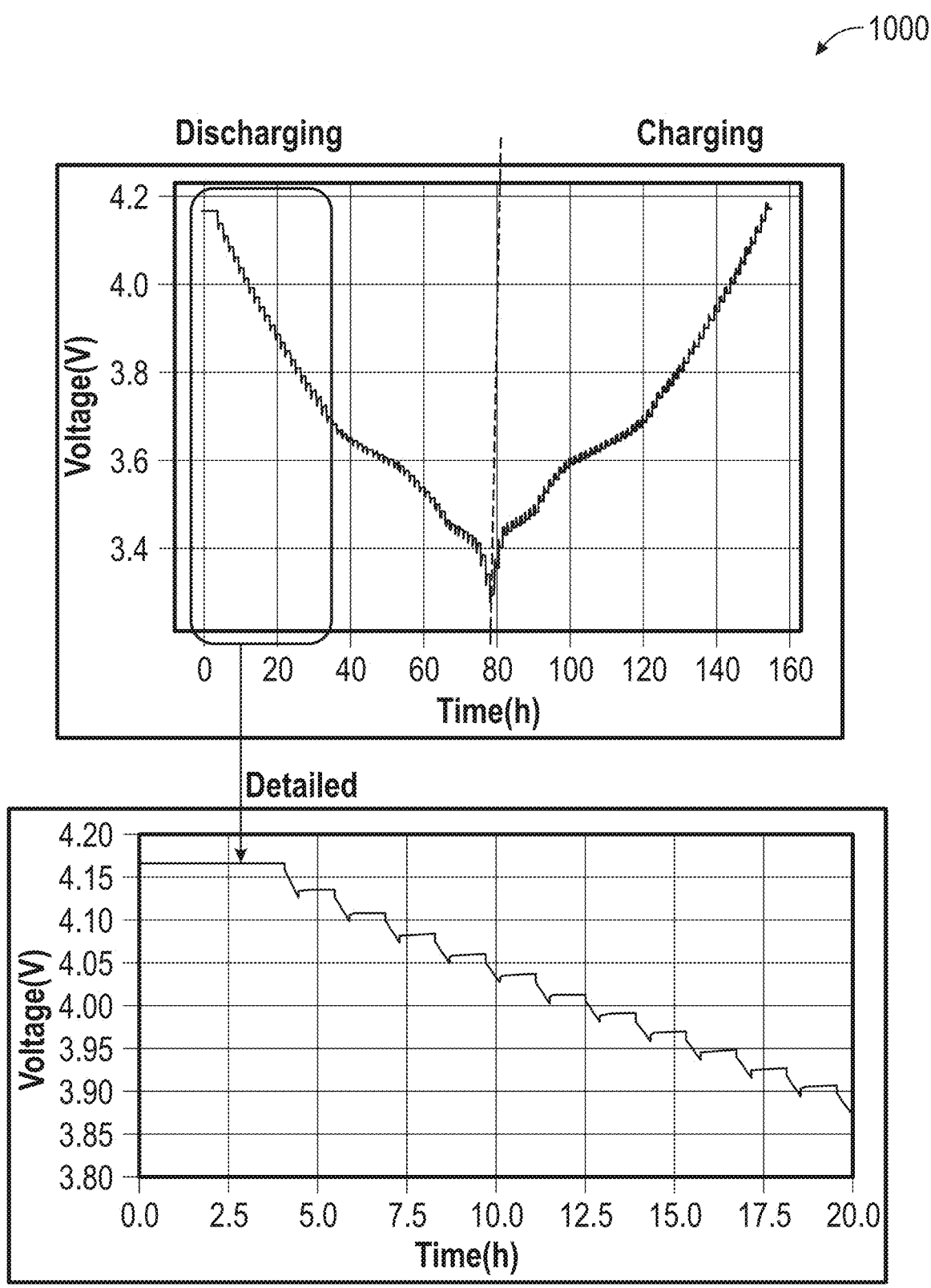
FIG. 10 illustrates an example state of charge/open-circuit voltage test according to certain embodiments of this disclosure.

FIG. 10 illustrates an example state of charge/open-circuit voltage test 1000 according to certain embodiments of this disclosure. As described above, the pre-training training dataset and the domain adaptation training dataset include data associated with SOC/OCV (state of charge/open-circuit voltage) test, which measures the voltage across the terminals of a battery pack when it is not connected to any load. This test may be used to estimate the SOC of a battery and assess its health. This test may be useful for determining the relationship between the battery's SOC and OCV, which can be used for estimating the battery pack's SOC during nomal operation.

Open-circuit voltage (OCV) tests measure a battery pack's voltage at different state of charge (SOC) levels under no-load conditions. The process involves a battery pack being charged to a specific SOC, rested to dissipate transient effects, and the charging OCV is recorded. The charging OCV may be used to calculate the SOC at rest points following a charging event, where the battery pack has been charged to a specific level and allowed to rest for voltage stabilization.

The battery may be discharged to a lower SOC, rested, and the OCV may be measured again. The discharging OCV may be recorded. The discharging OCV may be similarly used to determine the SOC at rest points after a discharging event, thereby ensuring the voltage reflects the true open-circuit condition.

This process is repeated across the SOC range (e.g., 0% to 100%) to create the SOC-OCV curve for both charging and discharging.

In SOC-OCV tests (FIG. 10), the process begins with a fully charged battery cell that is discharged in controlled increments to specific SOC levels. Once the battery cell is fully discharged, it is recharged in similarly controlled increments until it reaches the fully charged state again.

This bidirectional process-discharging followed by charging-ensures the generation of both charging and discharging SOC-OCV curves, which may capture the voltage behavior across the entire SOC range for accurate battery characterization.

Figure 11:
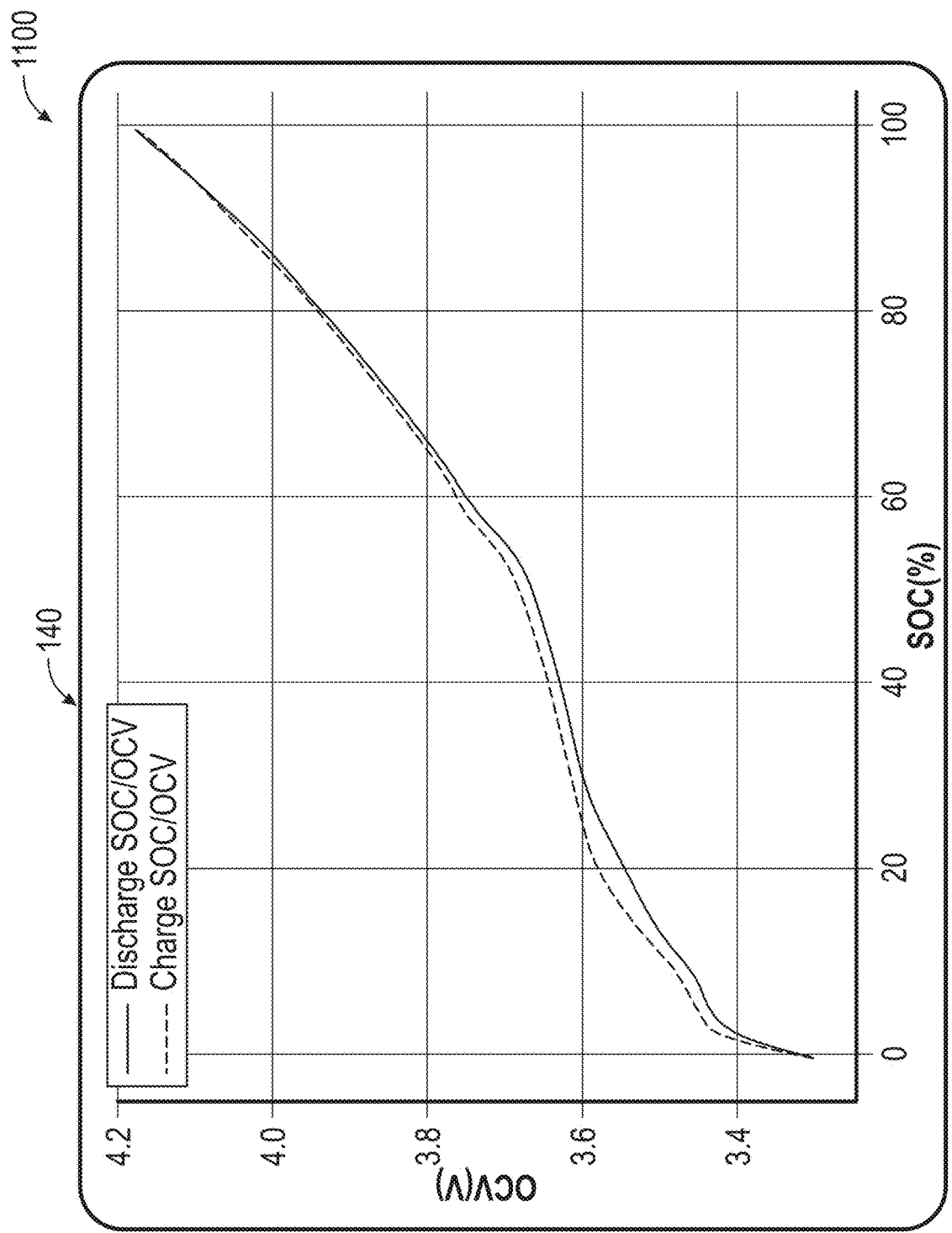
FIG. 11 illustrates an example charge and discharge state of charge/open-circuit voltage curve according to certain embodiments of this disclosure.

FIG. 11 illustrates an example charge and discharge state of charge/open-circuit voltage curve 1100 according to certain embodiments of this disclosure.

After the SOC-OCV tests, the SOC-OCV curve 1100 may be extracted by one or more processing devices. This curve 1100 may serve as a reference for calculating labels during a drive cycle. Using this curve 1100, the ground truth SOC values at rest points may be determined by one or more processing devices, which may provide reliable labels for supervised training. That is, the SOC values at rest points may be included as labels in input and/or output data in training datasets used to train one or more computer-implemented models 132 using supervised learning.

Figure 12:
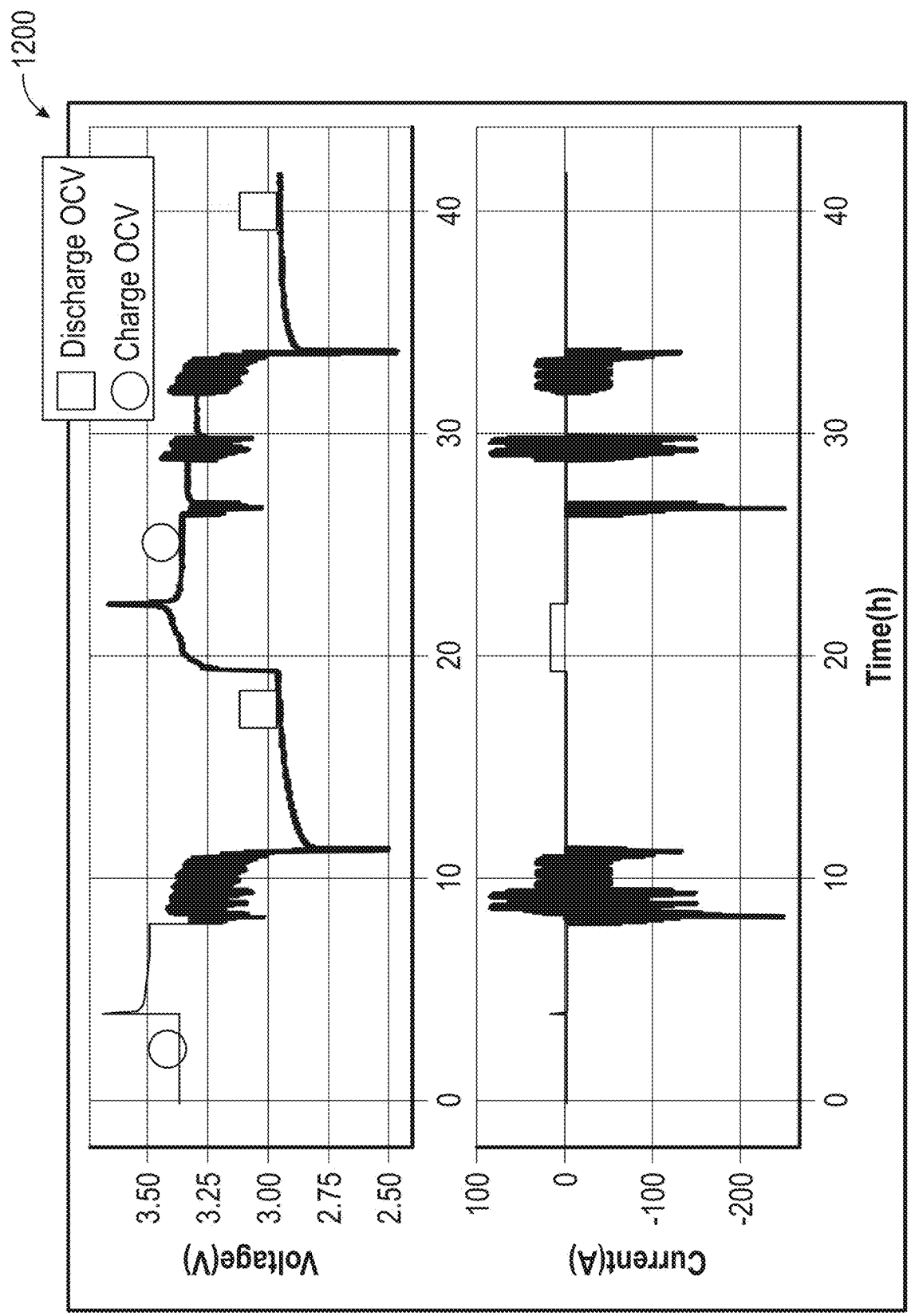
FIG. 12 illustrates an example driving cycle test according to certain embodiments of this disclosure.

FIG. 12 illustrates an example driving cycle test 1200 according to certain embodiments of this disclosure. A drive cycle test may simulate real-world driving conditions to evaluate battery performance under dynamic load and varying temperature conditions. The drive cycle test may enable assessing how the battery responds to typical usage patterns over time.

Drive cycle tests may be set up with different designs of experiments (DOE), each aimed at representing various conditions the cell might experience in real-world scenarios.

For SOC labels in training, rest points are detected, and at these rest points, SOC is determined using the SOC-OCV curve 1100, where SOC equals OCV (voltage). The stars in the FIG. 12 indicate candidate rest points. To identify the lighter shaded star start point SOC, the charging OCV-SOC curve may be used by one or more processing devices. For determining the darker shaded star start point SOC, the discharging OCV-SOC curve may be utilized by one or more processing devices.

After identifying these points and calculating their SOC values, intermediate SOC values may be interpolated using Coulomb counting. Coulomb counting may be a method that calculates SOC by tracking the charge entering or leaving the battery by measuring current over time. In some embodiments, this process may provide the SOC labels for the pre-training training dataset.

Figure 13:
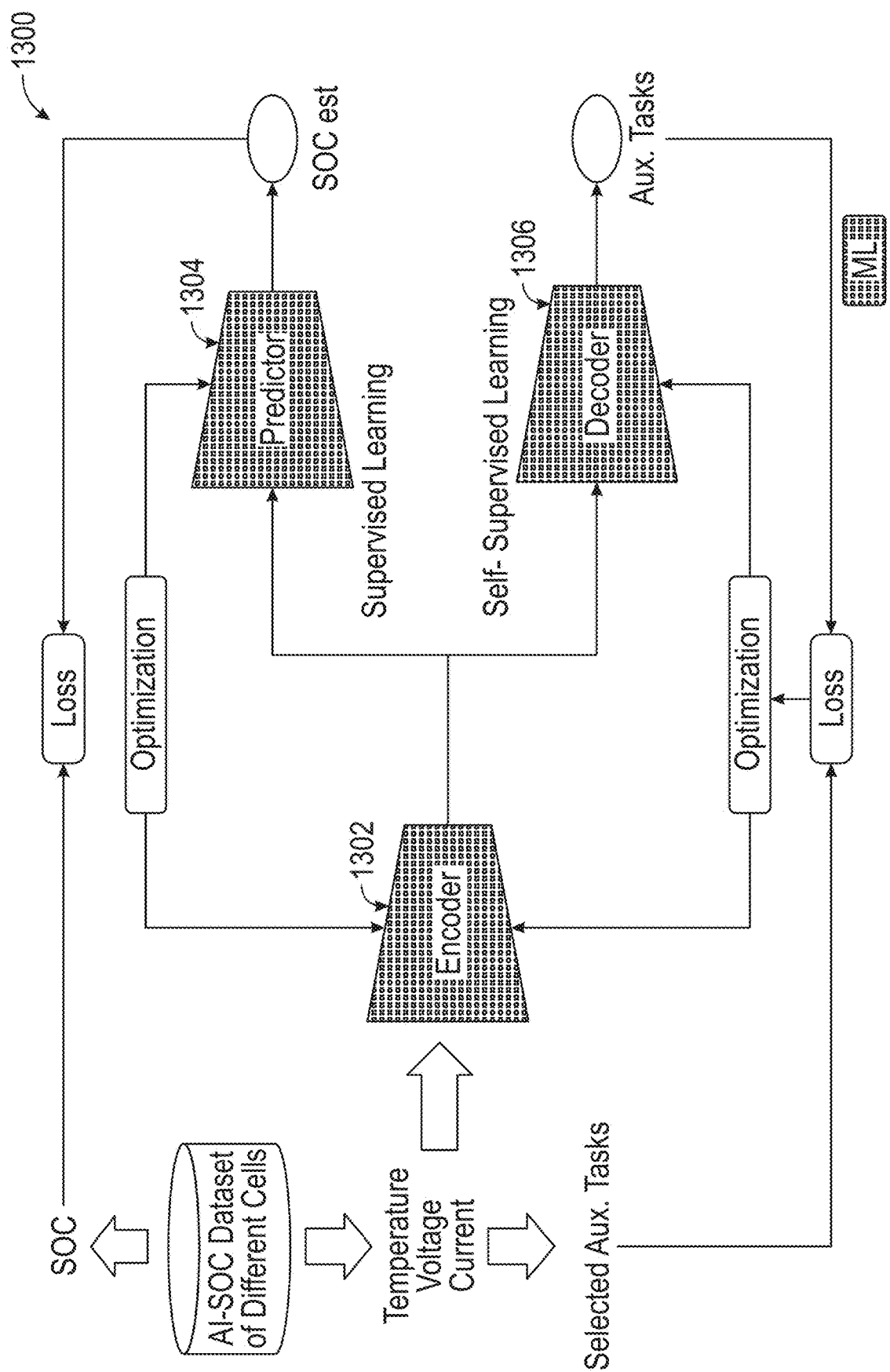
FIG. 13 illustrates an example flow diagram of initial training of components of one or more computer-implemented models to predict a state of charge and auxiliary tasks according to certain embodiments of this disclosure.

FIG. 13 illustrates an example flow diagram 1300 of initial training of components of one or more computer-implemented models 132 to predict a state of charge and auxiliary tasks according to certain embodiments of this disclosure. The components may include an encoder 1302, a predictor 1304, and/or a decoder 1306. The components may be implemented in computer instructions stored on one or more memory devices and executed by one or more processing devices. The components may be one or more machine learning models, neural networks, expert systems, etc.

The flow diagram 1300 illustrates a schematic for obtaining the pre-trained computer-implemented model 132. In this flow diagram 1300, the pre-training dataset of different battery cells may be used to build a computer-implemented model that captures a foundational understanding of the battery cells' behavior under laboratory conditions, providing a strong starting point for further tuning and refinement. This computer-implemented model uses an architecture with one encoder 1302, one decoder 1306, and one predictor 1304.

In some embodiments, the encoder 1302 may extract key features from the input data, creating a compact representation of the battery cells' behavior. The predictor 1304 may estimate SOC from the encoded data by using a supervised learning approach where the predictor 1302 learns directly from labeled SOC data. The decoder 1306 may predict auxiliary tasks, such as voltage, temperature, or ampere-hour (AH) counting, from the input data. The decoder 1306 may use self-supervised learning, which may enable the computer-implemented model 132 to extract additional useful information without labeled data from these auxiliary tasks. The auxiliary task predictions may be compared against ground truth data (voltage, current, and/or temperature measurements) obtained from sensors associated with the battery cells.

During pre-training, the computer-implemented model 132 may learn to recognize patterns in the pre-training dataset related to SOC using supervised learning. In supervised learning, the computer-implemented model 132 may be provided with labeled data, where each input (e.g., temperature, current, and/or voltage measurements) is paired with a known SOC label. By learning from these examples, the computer-implemented model 132 may become capable of predicting the SOC based on new/subsequent temperature, current, and/or voltage inputs it receives via sensor readings.

In addition to SOC estimation, the computer-implemented model 132 includes an additional branch designed for predicting auxiliary tasks, which may be a feature enabled by self-supervised learning. Self-supervised learning may refer to a method where the model generates its own labels from the training dataset, rather than relying on manually labeled data.

Here, the computer-implemented model 132 may use historical data points to predict the next data without needing explicit labels for each instance, which may allow the computer-implemented model 132 to improve its understanding of data changes under various conditions. This approach may enhance the computer-implemented model's 132 capacity to track dynamic battery behavior and may contribute to a more robust performance in real-life applications.

The following include examples of auxiliary tasks: (i) charge/discharge cycle segmentation: objective—predict the start and end of charge/discharge cycles from raw voltage and current signals; benefits—helps the computer-implemented model 132 distinguish between different operational phases, useful for SOC estimation, (ii) voltage drop prediction during rest periods: objective—predict the natural voltage drop during rest phases after charging or discharging events; benefits—assists in learning battery relaxation characteristics, which may be related to the internal resistance and SOH, (iii) entropy or internal resistance prediction: objective—predict entropy (e.g., via changes in voltage) or internal resistance at each cycle; benefits—enables a finer understanding of aging mechanisms, as these may be directly linked to battery health and degradation, (iv) cycle-level charge recovery prediction: objective—predict how much charge the battery pack can recover after resting periods based on past cycles; benefits—helps the model understand hysteresis effects and SOC recalibration needs, which may be important for accurate SOC assessments, (v) temperature-voltage-current relationship modeling: objective—learn the relationship between temperature, voltage, and current over time during different phases; benefits—may improve the computer-implemented model's general understanding of the battery pack's electrochemical dynamics, which may be valuable for accurate and robust state predictions.

In training, loss and optimization are processes that guide the computer-implemented model 132 to improve its predictions and performance with each iteration. Three steps may be used, loss calculation, backpropagation, and repeating for multiple epochs. A first step may include calculating the loss. A loss function may measure how well or poorly the computer implemented model's 132 predictions match the actual labels.

In some embodiments, two types of losses are calculated after each training loop. A first loss may be an SOC loss (supervised) which measures the difference between the predicted SOC from the decoder and the actual SOC labels. The mean squared error (MSE) may be used as the loss function, since it penalizes larger errors more heavily, making it effective for applications where minimizing significant deviations is important. The formula for MSE may be represented as follows:

$$MSE = \frac{1}{n}\sum_{i=1}^{n}(y_i - \hat{y}_i)^2$$

Where $y_i$ represents the ground truth value for the i-th sample, $\hat{y}_i$ the predicted value for the same sample, and n is the total number of samples.

Alternatively, the Mean Absolute Error (MAE) may also be used as a loss function. Unlike MSE, MAE may treat errors equally, without heavily penalizing larger errors. The formula for MAE is:

$$MAE = \frac{1}{n}\sum_{i=1}^{n}|y_i - \hat{y}_i|$$

Where $y_i$ and $\hat{y}_i$ represent the same terms as in MSE, and n is the total number of samples.

A second type of loss that may be calculated may be an auxiliary task loss (self-supervised). The auxiliary task loss may measure how well the decoder predicts auxiliary tasks. This might also use MSE or other relevant metrics depending on the auxiliary tasks.

A second step may include backpropagation. Once the loss is calculated, backpropagation may be used to update the computer-implemented model's 132 weights. An optimizer (such as adaptive moment estimation or stochastic gradient descent) may adjust the computer-implemented model's 132 parameters to minimize this loss.

This process involves two main activities. The first activity may be computing gradient. Backpropagation calculates the gradients (or partial derivatives) of the loss with respect to each weight in the model. These gradients indicate how much each weight contributed to the overall error, and in which direction the weights need to be adjusted. The second activity may be updating weights. The computer-implemented model's 132 weights may be updated using the gradients and an optimization algorithm.

Stochastic gradient descent (SGD) may refer to an optimization algorithm used to minimize a loss function by updating the computer-implemented model's 132 weights using the gradient of the loss with respect to the weights. SGD processes the data in mini-batches, updating the weights after each batch.

Adaptive moment estimation (Adam) is an adaptive optimization algorithm that computes adaptive learning rates for each parameter based on both the first moment (mean) and second moment (uncentered variance) of the gradients.

A third step may include repeating for multiple epochs. The above loss calculation and backpropagation process may repeated for multiple epochs (iterations over the entire dataset). With each epoch: (i) the computer-implemented model's weights may be updated to minimize the loss, (ii) gradual improvements in the computer-implemented model's ability to make predictions are made, and (iii) backpropagation helps the computer-implemented model learn by adjusting its weights to better predict the outputs.

By the end of the training process, the computer-implemented model converges to a set of weights for parameters that minimize the loss and provide accurate predictions.

In some embodiments, after each epoch, the computer-implemented model's performance may be evaluated using the updated weights, checking if the computer-implemented model is moving toward lower losses. Over time, this process may allow the computer-implemented model to converge, or stabilize, at an optimal set of parameters that perform well on both the SOC and auxiliary tasks. These parameters may be transmitted to the edge processing device from the cloud-based computing system 116 to cause the edge processing device to configure the AI-SOC NN executing at the edge.

The disclosed techniques may enable the computer-implemented model to iteratively learn by minimizing the loss with each training loop, using optimization to fine-tune its parameters toward accurate SOC and auxiliary predictions.

Figure 14:
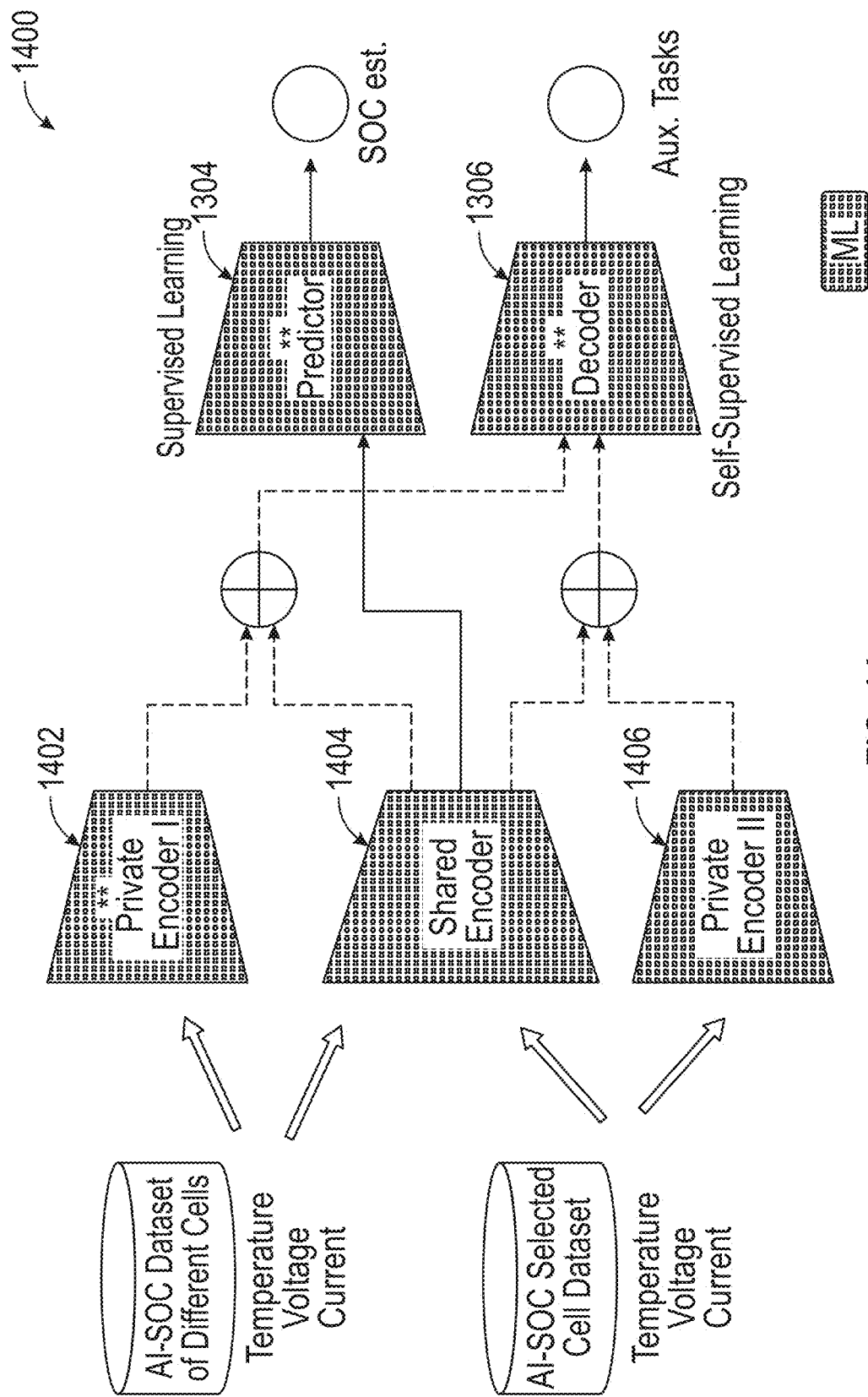
FIG. 14 illustrates an example domain adaptation architecture according to certain embodiments of this disclosure.

FIG. 14 illustrates an example domain adaptation architecture 1400 according to certain embodiments of this disclosure. The architecture includes various components of one or more computer-implemented models 132. The components may include a first private encoder 1402, a shared encoder 1404, a second private encoder 1406, a predictor 1408, and a decoder 1410. The components may be implemented in computer instructions stored on one or more memory devices and executed by one or more processing devices. The components may be one or more machine learning models, neural networks, expert systems, etc.

Once the pre-trained computer-implemented model is ready, fine-tuning may leverage the domain adaptation architecture 1400 by the cloud-based computing system 116. This architecture 1600 retains a similar setup to the pre-trained computer-implemented model with one predictor 1304 and one decoder 1306 but introduces three encoders: two private encoders 1402 and 1406 and one shared encoder 104.

In FIG. 14, each private encoder 1402 and 1406 is responsible for learning representations that are unique to a specific domain. The first private encoder 1402 may be pre-trained on the general, diverse dataset and thus retains knowledge about multiple battery cells. The second private encoder 1406, on the other hand, may be trained specifically on the targeted cell data during a fine-tuning phase. By having these separate private encoders, the computer-implemented model 132 may capture domain-specific nuances without the risk of overgeneralizing or mixing features that are unique to one domain.

The shared encoder 1404 may function as bridges between domains between pre-trained datasets and selected (targeted) datasets. The shared encoder 1404 may be trainable and adapts to the target domain, learning features that are generalizable across both the pre-trained and selected cell data. This structure may enable the computer-implemented model 132 to balance general features (from the pre-trained battery cell dataset) with specific adaptations (from the target battery cell dataset) in a controlled manner.

In some embodiments, the predictor 1304 may function as the main supervised learning component responsible for predicting the state of charge (SOC). The decoder 1306 may be designed to predict auxiliary tasks related to the SOC prediction process, which may provide a comprehensive understanding of the battery cell's behavior.

In the domain adaptation architecture 1400, the predictor 1304, decoder 1306, and the first private encoder 1402 are initialized with pre-trained computer-implemented model's weights (indicated with **). The predictor 1304, decoder 1306, and first private encoder 1402 in the domain adaptation setup may be initially configured with the same weights as the pre-trained model's component.

During the retraining phase, the first private encoder 1402 may be frozen which may refer to weights associated with its parameters being fixed and not undergoing updates (e.g., the weights remain unmodified). This freezing may preserve the general representations learned from pre-training. The model may preserve essential, general features learned from the pre-training phase. This stability may prevent overfitting to the target battery cell data and may support robust performance across domains.

In contrast, the shared encoder 1404, second private encoder 1406, predictor 1304, and the decoder 1306 may be actively optimized for the target domain by updating tunable weights. Thus, the shared encoder 1404, second private encoder 1406, predictor 1304, and the decoder 1306 may be referred to as tunable components. Fine-tuning the shared encoder 1404, second private encoder 1406, predictor 1304, and the decoder 1306 may enable the computer-implemented model to adapt to the target domain's unique characteristics without losing generalization. This selective optimization approach may enable efficient training by focusing updates where adaptation is needed, which may achieve a balance between general knowledge retention and target domain specialization.

In some embodiments, optimization refers to adjusting the weights of the shared encoder 1404, second private encoder 1406, predictor 1304, and the decoder 1306 to minimize prediction errors for the target battery cell's dataset. This may typically be achieved through backpropagation, where gradients are calculated based on the model's prediction errors (loss) and may be used to iteratively update the trainable and/or tunable weights.

By optimizing only a subset of the computer-implemented model's encoders (shared encoder 1404 and second private encoder 1406), along with the predictor 1304 and decoder 1306, the computer-implemented model may specialize to the new domain while retaining the foundational knowledge from the pre-trained computational model's frozen first private encoder 1402. This selective fine-tuning approach may balance preserving general knowledge with adapting to the specific characteristics of the target battery cell.

By structuring the computer-implemented model with both frozen and trainable or tunable components, a form of transfer learning may be achieved. The pre-trained computer-implemented model may provide a solid foundation, while domain-specific layers may allow the computer-implemented model to specialize to a targeted battery cell without forgetting the core patterns learned from diverse battery cell types. This architecture may be particularly effective when the target battery cell data is limited, as it enables the computer-implemented model to retain valuable information from the pre-training phase while adapting to specific conditions in a focused and efficient manner.

Once the computer-implemented model is fine-tuned, the shared encoder 1404 and predictor 1304—which are may determine an SOC prediction—may be extracted and deployed to edge devices (e.g., one or more edge processing devices). The shared encoder 1404 processes input features such as voltage, current, and/or temperature, while the predictor 1304 utilizes these processed features to predict the SOC. By deploying only these components 1404 and 1304, the system may enable efficient and accurate SOC predictions in real-time while minimizing computational overhead on edge devices. That is, instead of deploying all of the components (e.g., first private encoder 1402, shared encoder 1404, second private encoder 1406, predictor 1304, and decoder 1306), just a subset of the components (e.g., the shared encoder 1404 and predictor 1304) are deployed to the edge processing devices, which causes less processing and memory resources to be consumed at the edge devices. Further, execute fewer components may enable the edge processing device to determine the SOC prediction faster in a more efficient manner.

Figure 15:
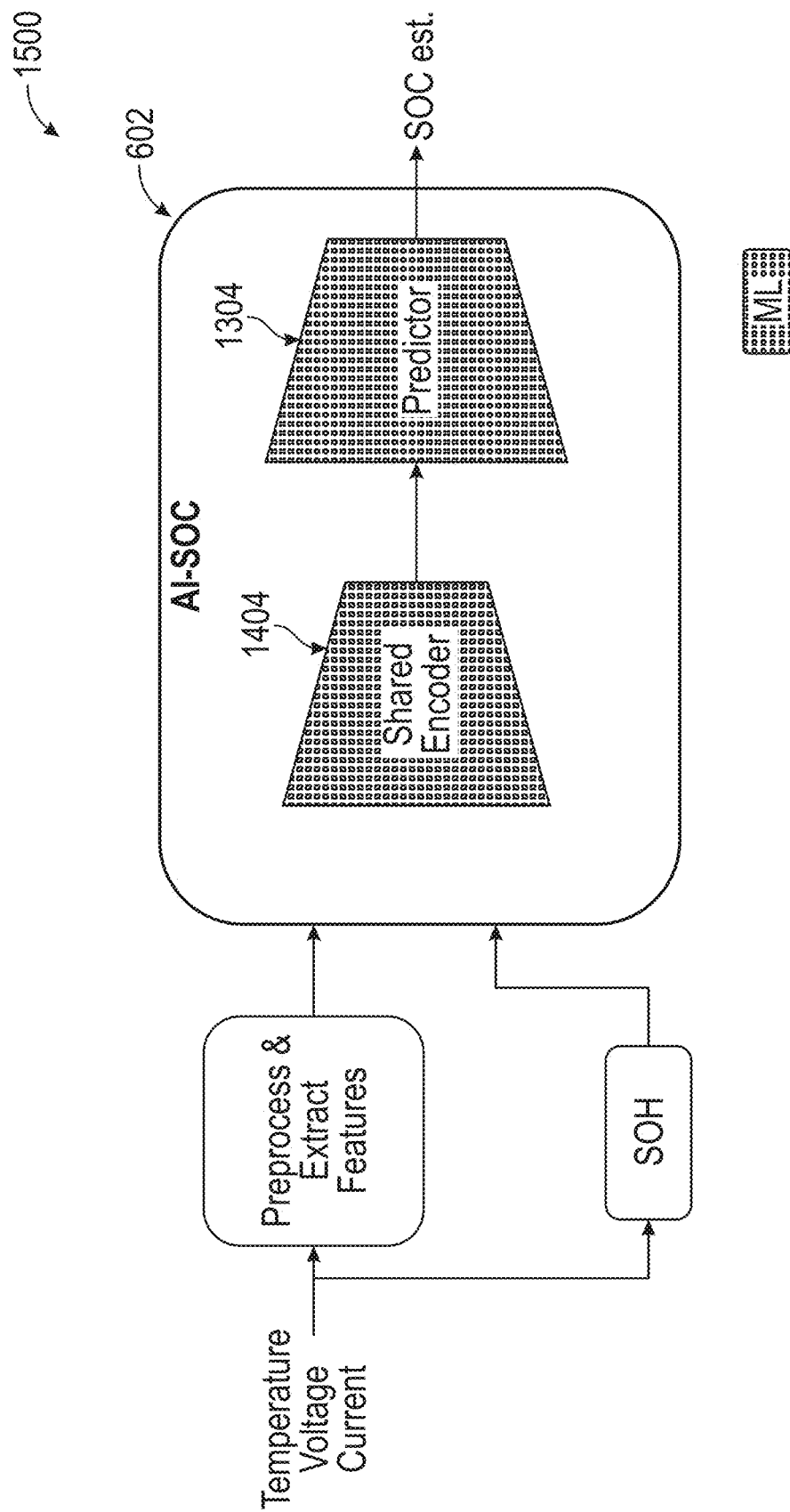
FIG. 15 illustrates an example flow diagram of activities that occur at an edge according to certain embodiments of this disclosure.

FIG. 15 illustrates an example flow diagram 1500 of activities that occur at an edge according to certain embodiments of this disclosure. The edge processing device may be the first layer of an AI-SOC system executing on a computing device 102 at an edge/vehicle 117, where sensor data is collected during battery operation of the edge/vehicle 117. Sensor data collection may be beyond human capability as the human mind cannot digitally measure voltage, current, and/or temperature. In some embodiments, sensors may continuously measure key parameters such as voltage, current, and temperature, and additional features like state of health (SOH). The edge processing device may derive Ah counting.

Before the data is processed, the raw sensor readings may be filtered by the edge processing device to remove noise, ensuring only clean and reliable features of the sensor data may be used. These features may include (i) filtered current, voltage, and temperature measurements; (ii) Ah counting for charge tracking. Ampere-hour (Ah) counting, also known as coulomb counting, may involve tracking the current flowing into and out of the battery over time. Coulomb counting may provide an estimate of the charge transferred, which may be used for determining the battery's SOC.

$$Ah\ \text{Count} = \int I(t)dt$$

where I(t) s the current at time t; and (iii) state of health (SOH) for understanding battery degradation. By including SOH as a feature in the computer-implemented model (e.g., AI-SOC NN 602 including the shared encoder 1404 and the predictor 1304 in FIG. 15), the computer-implemented model becomes health-aware, meaning the computer-implemented model may account for the effects of battery degradation when predicting the SOC.

The disclosed techniques, combined with voltage and other features, helps refine SOC prediction and/or estimation. The extracted features may be fed into one or more machine learning models, which may be deployed from the cloud-based computing system 116 to the one or more edge processing devices at an edge device (e.g., vehicle 117).

As described with reference to the initial deployment activities herein, the computer-implemented model 132 may be first trained on a diverse dataset and then fine-tuned with the selected battery cell dataset. The computer-implemented model architecture may include shared encoders, private encoders, a decoder, and a predictor. However, on edge devices, in some embodiments, only the shared encoder 1404 and predictor 1304 are deployed, as edge processing devices may be solely responsible for SOC predictions. The shared encoder 1404 may process the sensor data, and the predictor 1304 may use this information to estimate real-time SOC on edge devices. The components deployed and run on an embedded chip within the edge device (e.g., edge processing device), enabling real-time SOC prediction without requiring constant connectivity to the cloud-based computing system 116.

Once the model predicts the SOC, this information may be transmitted to the battery management system (BMS), which then transmits it to the user interface (UI) 604.

The SOC may be displayed to the user in an easy-to-understand format, allowing the user to monitor the battery's charge status effectively. This edge-to-UI pipeline may ensure low-latency, real-time SOC predictions while offloading intensive computations to the cloud-based computing system 116 for periodic updates and retraining. Further, the predicted SOC may be used to dynamically control operation of the vehicle 117 and/or battery pack.

To enable continuous learning and optimize the system, sensor data along with the AI-SOC NN's predictions may be regularly or periodically sent to the cloud-based computing system 116. This may ensure that the cloud-based computing system 116 receives a complete dataset from the entire fleet, which may be essential for performance monitoring.

As described herein with reference to continuous learning, by analyzing the computer-implemented model's predictions and comparing them with the actual outcomes, any significant divergence in computer-implemented model performance is identified. If discrepancies are found, the computer-implemented model may be redeployed from the cloud-based computing system 116 with updated parameters, ensuring the system adapts to real-world conditions and maintains high accuracy over time. This process of periodic model updates from the cloud-based computing system 116 may help improve overall performance and reliability of the AI-SOC NN.

Figure 16:
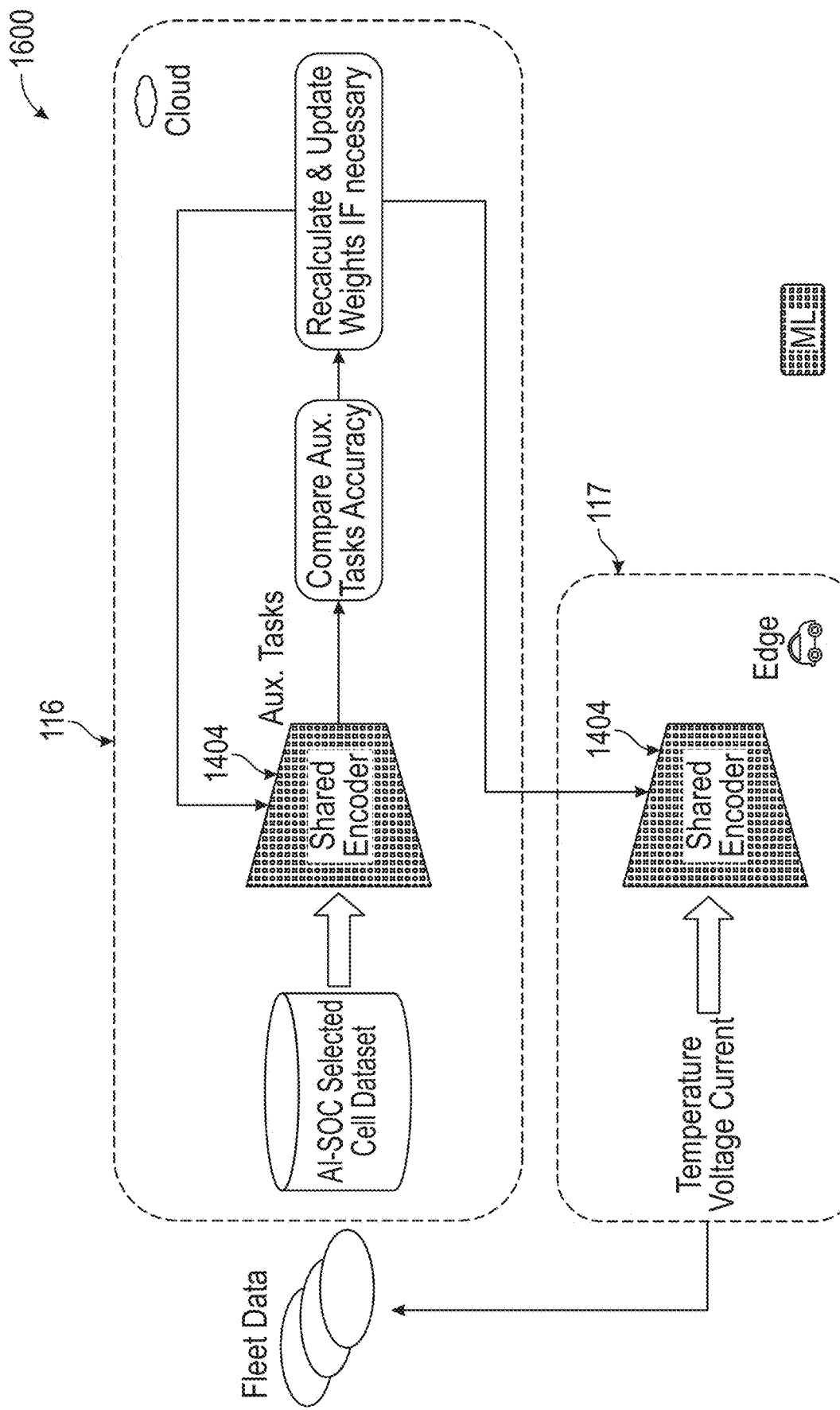
FIG. 16 illustrates an example continuous learning architecture according to certain embodiments of this disclosure.

FIG. 16 illustrates an example continuous learning architecture 1600 according to certain embodiments of this disclosure.

After the computer-implemented model (e.g., shared encoder 1404 and predictor 1304) is deployed to edge devices, its accuracy may be monitored on a continuous, continual, and/or periodic basis to ensure it remains reliable throughout its lifecycle.

To maintain this accuracy, a fine-tuning process may be performed in the cloud-based computing system 116 using data collected from the fleet. However, since SOC may lack ground truth labels in this data, the fine-tuning may focus exclusively on auxiliary task predictions. This process involves updating only the encoders associated with the auxiliary tasks. By improving the shared encoder's 1404 ability to extract meaningful features from the data, the model indirectly enhances the quality of SOC predictions, as the same shared encoder 1404 is also utilized for SOC predictions. The updated weights associated with parameters of the retrained shared encoder 1404 may be transmitted to the edge processing devices from the cloud-based computing system 116 for implementation. This continuous improvement mechanism ensures long-term accuracy and adaptability in real-world applications.

In the cloud-based computing system 116, the computer-implemented model's auxiliary task may be recalculated using the same shared encoder model weights and predictions may be compared against the calculated or determined values from the collected data. If the error exceeds a predefined threshold, the computer-implemented model may be determined to require fine-tuning. The shared encoder's 1404 weights may be recalculated and/or fine-tuned and transmitted to all edge processing devices in the fleet.

During the fine-tuning phase in continuous learning, the predictor 1304 may be frozen, referring to its weights remain fixed and are not updated (e.g., remain unmodified). This is because the predictor 1304 may be trained using supervised learning with SOC labels, which may not be collected as ground truth SOC from the fleet data.

However, the shared encoder 1404 in SOC prediction may be updated through fine-tuning based on auxiliary task predictions. This process may refine the computer-implemented model's ability to extract and process features, improving its overall performance. Once fine-tuned, at some components of the updated computer-implemented model (e.g., the shared encoder 1404) may be redeployed to the fleet edge processing devices. There may not be a need to redeploy the predictor 1304 if its weights are frozen, which may aid accurate SOC predictions throughout the battery's lifecycle.

Figure 17:
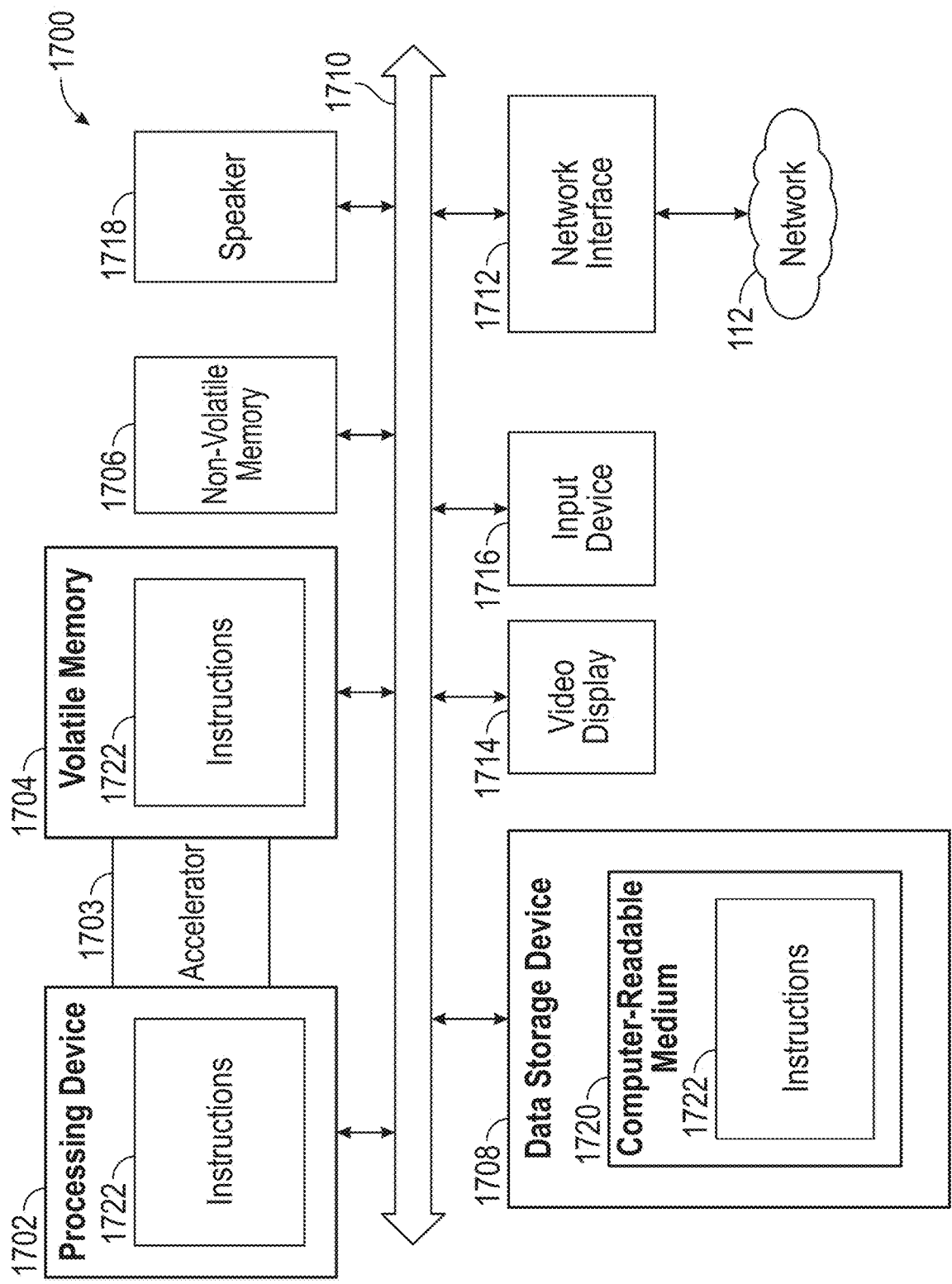
FIG. 17 illustrates an example computer system according to certain embodiments of this disclosure.

FIG. 17 illustrates example computer system 1700 which can perform any one or more of the methods described herein, in accordance with one or more aspects of the present disclosure. In one example, computer system 1700 may correspond to the computing device 102 (e.g., user computing device, vehicle computing device), one or more servers 128 of the cloud-based computing system 116, the training engine 130, any component of the vehicle 117, or any suitable component of FIG. 1. The computer system 1700 may be capable of executing the one or more machine learning models 132 of FIG. 1. The computer system may be connected (e.g., networked) to other computer systems in a LAN, an intranet, an extranet, or the Internet. The computer system may operate in the capacity of a server in a client-server network environment. The computer system may be a personal computer (PC), a tablet computer, a wearable (e.g., wristband), a set-top box (STB), a personal Digital Assistant (PDA), a mobile phone, a camera, a video camera, or any device capable of executing a set of instructions (sequential or otherwise) that specify actions to be taken by that device. Further, while only a single computer system is illustrated, the term "computer" shall also be taken to include any collection of computers that individually or jointly execute a set (or multiple sets) of instructions to perform any one or more of the methods discussed herein.

The computer system 1700 includes a processing device 1702, a volatile memory 1704 (e.g., random access memory (RAM)), a non-volatile memory 1706 (e.g., read-only memory (ROM), flash memory, solid state drives (SSDs), and a data storage device 1708, the foregoing of which are enabled to communicate with each other via a bus 1710.

Processing device 1702 represents one or more general-purpose processing devices such as a microprocessor, central processing unit, or the like. More particularly, the processing device 1702 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 1702 may also be one or more special-purpose processing devices such as an application specific integrated circuit (ASIC), a system on a chip, a field programmable gate array (FPGA), a digital signal processor (DSP), network processor, or the like. The processing device 1702 may include more than one processing device, and each of the processing devices may be the same or different types. The processing device 1702 may include or be communicatively coupled to one or more accelerators 1703 configured to offload various data-processing tasks from the processing device 1702. The processing device 1702 is configured to execute instructions for performing any of the operations and steps discussed herein. The processing device 1702 may be an edge processing device or a processing device used by one of the servers 128.

The computer system 1700 may further include a network interface device 1712. The network interface device 1712 may be configured to communicate data via any suitable communication protocol. In some embodiments, the network interface devices 1712 may enable wireless (e.g., WiFi, Bluetooth, ZigBee, etc.) or wired (e.g., Ethernet, etc.) communications. The computer system 1700 also may include a video display 1714 (e.g., a liquid crystal display (LCD), a light-emitting diode (LED), an organic light-emitting diode (OLED), a quantum LED, a cathode ray tube (CRT), a shadow mask CRT, an aperture grille CRT, or a monochrome CRT), one or more input devices 1716 (e.g., a keyboard or a mouse), and one or more speakers 1718 (e.g., a speaker). In one illustrative example, the video display 1714 and the input device(s) 1716 may be combined into a single component or device (e.g., an LCD touch screen).

The output device 1750 may transmit and receive data from a computer system application programming interface (API). The data may pertain to any suitable information described herein, such as a remaining useful life of a battery pack, among other information.

The data storage device 1708 may include a computer-readable medium 1720 on which the instructions 1722 embodying any one or more of the methods, operations, or functions described herein is stored. The instructions 1722 may also reside, completely or at least partially, within the volatile memory 1704 or within the processing device 1702 during execution thereof by the computer system 1700. As such, the volatile memory 1704 and the processing device 1702 also constitute computer-readable media. The instructions 1722 may further be transmitted or received over a network via the network interface device 1712.

While the computer-readable storage medium 1720 is shown in the illustrative examples to be a single medium, the term "computer-readable storage medium" should be taken to include a single medium or multiple media (e.g., a centralized or distributed database, or associated caches and servers) that store the one or more sets of instructions. The term "computer-readable storage medium" shall also be taken to include any medium capable of storing, encoding, or carrying a set of instructions for execution by the machine, where such set of instructions cause the machine to perform any one or more of the methodologies of the present disclosure. The term "computer-readable storage medium" shall accordingly be taken to include, but not be limited to, solid-state memories, optical media, and magnetic media.

None of the description in this application should be read as implying that any particular element, step, or function is an essential element that must be included in the claim scope. The scope of patented subject matter is defined only by the claims. Moreover, none of the claims is intended to invoke 35 U.S.C. § 112(f) unless the exact words "means for" are followed by a participle.

Consistent with the above disclosure, the examples of systems and method enumerated in the following clauses are specifically contemplated and are intended as a non-limiting set of examples.

1. A computer-implemented method comprising:
   receiving, from one or more sensors, one or more measurements comprising battery cell voltage, current, temperature, or some combination thereof;
   determining, via one or more first computer-implemented models using the one or more measurements, a state of charge prediction, wherein:
   the one or more first computer-implemented models are initially trained to determine the state of charge prediction using a first training dataset comprising data pertaining to a plurality of battery cells generated based on at least one of state of charge tests of the plurality of battery cells, open-circuit voltage tests of the plurality of battery cells, and drive cycle tests of the plurality of battery cells,
   the one or more first computer-implemented models are additionally trained to determine the state of charge prediction using a second training dataset comprising data pertaining to a target battery cell generated based on at least one of state of charge tests of the target battery cell, open-circuit voltage tests of the target battery cell, and drive cycle tests of the target battery cell; and
   transmitting one or more parameters of the one or more first computer-implemented models to an edge processing device to cause the edge processing device to execute at least a portion of the one more first computer-implemented models to predict the state of charge prediction and to control operation of a battery pack based on the state of charge prediction.

2. The computer-implemented method of any clause herein, wherein the one or more first computer-implemented models are initially trained by:
   storing the first training dataset as diverse data pertaining to a plurality of battery chemistries and a plurality of cell patterns, wherein the diverse data pertains to a battery pack current, a cell voltage, a cell current, a cell temperature, or some combination thereof under a range of temperatures comprising extremities, varying charging, varying discharging, and varying stress conditions, wherein the diverse data comprises:
   first diverse data received from sensors of battery packs,
   second diverse data pertaining to the battery packs from lab tests of a manufacturer of the battery packs,
   third diverse data pertaining to synthetically generated data associated with the battery packs,
   fourth diverse data pertaining to a plurality of battery chemistries and the plurality of cell patterns' open-circuit voltage during charging and discharging; and
   generating the diverse data by merging the first, second, third, and fourth diverse data for the plurality of battery chemistries and the plurality of cell patterns without any gaps in temperature, charging, discharging steps, and stress conditions pertaining to loads from light to heavy including extremities.

3. The computer-implemented method of any clause herein, wherein the diverse data is paired and stored with known state of charge labels for supervised learning and stored without any labels for unsupervised learning.

4. The computer-implemented method of any clause herein, wherein the second training dataset comprises data pertaining to a single target battery chemistry and a single target cell structure.

5. The computer-implemented method of any clause herein, wherein the first and second training datasets comprise the open-circuit voltage tests of the plurality of battery cells and target battery cell generated by:
   measuring open-circuit voltage of a fully charged cell and discharging the cell in small increments to lower state of charge, resting for transients to dissipate and measuring open-circuit voltage at each increment and, once fully discharged, charging the cell to a new state of charge level in small increments, resting for transients to dissipate and measuring open-circuit voltage at each increment until the cell is fully charged and plotting a charging and discharging open-circuit voltage and state of charge graph allowing determination and storing state of charge labels for training.

6. The computer-implemented method of any clause herein, further comprising, based on the state of charge prediction of the battery pack, controlling operation of a vehicle, charging of the battery pack, or both.

7. The computer-implemented method of any clause herein, further comprising generating, using one or more simulated battery usage conditions, synthetic data to include in the first training dataset, wherein the one or more simulated battery usage conditions comprise edge cases or rare events.

8. The computer-implemented method of any clause herein, wherein the state of charge tests measure voltage across terminals of battery packs comprising the plurality of battery cells, the target battery cell, or some combination thereof when they are not connected to any load.

9. The computer-implemented method of any clause herein, wherein the open-circuit voltage tests measure voltage of battery packs at different state of charge levels under no-load conditions.

10. The computer-implemented method of any clause herein, wherein the drive cycle tests simulate real-world driving conditions to evaluate battery performance under dynamic load and varying temperature conditions.

11. The computer-implemented method of any clause herein, wherein:
the edge processing device determines, using one or more second computer-implemented models, a state of health prediction of the battery pack, wherein the state of health prediction relates to a degradation of the battery pack, and
the edge processing device determines, via the at least the portion of the one or more first computer-implemented models and using the state of health prediction of the battery pack, the state of charge prediction of the battery pack.

12. The computer-implemented method of any clause herein, further comprising preprocessing on the edge the one or more measurements by filtering noise from sensor data, extracting features, or some combination thereof to refine the one or more measurements;

13. The computer-implemented method of any clause herein, wherein the one or more first computer-implemented models comprise one or more machine learning models.

14. A tangible, non-transitory computer-readable medium storing instructions that, when executed, cause a processing device to:
receive, from one or more sensors, one or more measurements comprising battery cell voltage, current, temperature, or some combination thereof;
determine, via one or more first computer-implemented models using the one or more measurements, a state of charge prediction, wherein:
the one or more first computer-implemented models are initially trained to determine the state of charge prediction using a first training dataset comprising data pertaining to a plurality of battery cells generated based on at least one of state of charge tests of the plurality of battery cells, open-circuit voltage tests of the plurality of battery cells, and drive cycle tests of the plurality of battery cells,
the one or more first computer-implemented models are additionally trained to determine the state of charge prediction using a second training dataset comprising data pertaining to a target battery cell generated based on at least one of state of charge tests of the target battery cell, open-circuit voltage tests of the target battery cell, and drive cycle tests of the target battery cell; and
transmit one or more parameters of the one or more first computer-implemented models to an edge processing device to cause the edge processing device to execute at least a portion of the one more first computer-implemented models to predict the state of charge prediction and to control operation of a battery pack based on the state of charge prediction.

15. The computer-readable medium of any clause herein, wherein the one or more first computer-implemented models are initially trained by:
storing the first training dataset as diverse data pertaining to a plurality of battery chemistries and a plurality of cell patterns, wherein the diverse data pertains to a battery pack current, a cell voltage, a cell current, a cell temperature, or some combination thereof under a range of temperatures comprising extremities, varying charging, varying discharging, and varying stress conditions, wherein the diverse data comprises:
first diverse data received from sensors of battery packs,
second diverse data pertaining to the battery packs from lab tests of a manufacturer of the battery packs,
third diverse data pertaining to synthetically generated data associated with the battery packs,
fourth diverse data pertaining to a plurality of battery chemistries and the plurality of cell patterns' open-circuit voltage during charging and discharging; and
generating the diverse data by merging the first, second, third, and fourth diverse data for the plurality of battery chemistries and the plurality of cell patterns without any gaps in temperature, charging, discharging steps, and stress conditions pertaining to loads from light to heavy including extremities.

16. The computer-readable medium of any clause herein, wherein the diverse data is paired and stored with known state of charge labels for supervised learning and stored without any labels for unsupervised learning.

17. The computer-readable medium of any clause herein, wherein the second training dataset comprises data pertaining to a single target battery chemistry and a single target cell structure.

18. The computer-readable medium of any clause herein, wherein the first and second training datasets comprise the open-circuit voltage tests of the plurality of battery cells and target battery cell generated by:
measuring open-circuit voltage of a fully charged cell and discharging the cell in small increments to lower state of charge, resting for transients to dissipate and measuring open-circuit voltage at each increment and, once fully discharged, charging the cell to a new state of charge level in small increments, resting for transients to dissipate and measuring open-circuit voltage at each increment until the cell is fully charged and plotting a charging and discharging open-circuit voltage and state of charge graph allowing determination and storing state of charge labels for training.

19. The computer-readable medium of any clause herein, wherein the processing device is further to, based on the state of charge prediction of the battery pack, control operation of a vehicle, charging of the battery pack, or both.

20. A system comprising:
one or more memory devices storing instructions; and
one or more processing devices communicatively coupled to the one or more memory devices, wherein the one or more processing devices execute the instructions to:
receive, from one or more sensors, one or more measurements comprising battery cell voltage, current, temperature, or some combination thereof;
determine, via one or more first computer-implemented models using the one or more measurements, a state of charge prediction, wherein:
the one or more first computer-implemented models are initially trained to determine the state of charge prediction using a first training dataset comprising data pertaining to a plurality of battery cells generated based on at least one of state of charge tests of the plurality of battery cells, open-circuit voltage tests of the plurality of battery cells, and drive cycle tests of the plurality of battery cells,
the one or more first computer-implemented models are additionally trained to determine the state of charge prediction using a second training dataset comprising data pertaining to a target battery cell generated based on at least one of state of charge tests of the target battery cell, open-circuit voltage tests of the target battery cell, and drive cycle tests of the target battery cell; and transmit one or more parameters of the one or more first computer-implemented models to an edge processing device to cause the edge processing device to execute at least a portion of the one more first computer-implemented models to predict the state of charge prediction and to control operation of a battery pack based on the state of charge prediction.

21. A computer-implemented method comprising:

generating, at a cloud-based computing system, a computer-implemented model comprising a domain adaptation architecture, wherein the computer-implemented model is trained to predict a state of charge of a target battery cell, and the domain adaptation architecture comprises:
- a first private encoder that is pre-trained using first data pertaining to a plurality of battery cells in a fleet,
- a shared encoder that is trained using the first data and second data pertaining to a target battery cell, and
- a computer-implemented predictor that is trained to predict the state of charge of the target battery cell using output from the first private encoder and the shared encoder; and deploying, to an edge processing device, the shared encoder and the predictor to cause the edge processing device to predict the state of charge of the target battery cell when sensor data pertaining to a battery pack is received by the edge processing device.

22. The computer-implemented method of any clause herein, wherein the domain adaptation architecture comprises:
- a second private encoder that is trained using the second data pertaining to the target battery cell, and
- a decoder that is trained to output at least one auxiliary task prediction based on output from the second private encoder and the shared encoder.

23. The computer-implemented method of any clause herein, further comprising:
- receiving, at the cloud-based computing system, the sensor data;
- determining whether a difference between the at least one auxiliary task prediction and the sensor data satisfy an error threshold;
- responsive to determining that the difference satisfies the error threshold, retraining the shared encoder; and
- redeploying the shared encoder to the edge processing device.

24 The computer-implemented method of any clause herein, wherein the first private encoder and the computer-implemented predictor remained unmodified when the shared encoder is retrained.

25. The computer-implemented method of any clause herein, wherein the first private encoder, the shared encoder, and the computer-implemented predictor comprise one or more machine learning models.

26. The computer-implemented method of any clause herein, wherein the first data comprises fleet data pertaining to fleet battery cells' temperature, voltage, current, or some combination thereof, and the second data comprises target battery cell data pertaining to the target battery cell's temperature, voltage, current, or some combination thereof.

27. The computer-implemented method of any clause herein, further comprising training the computer-implemented predictor using supervised learning with training data labeled indicating a state of charge of a battery cell.

28. The computer-implemented method of any clause herein, further comprising training the decoder using self-supervised learning with unlabeled training data.

29. The computer-implemented method of any clause herein, further comprising:
- storing the first data as diverse data pertaining to a plurality of battery chemistries and a plurality of cell patterns, wherein the diverse data pertains to a battery pack current, a cell voltage, a cell current, a cell temperature, or some combination thereof under a range of temperatures comprising extremities, varying charging, varying discharging, and varying stress conditions, wherein the diverse data comprises:
- first diverse data received from sensors of battery packs,
- second diverse data pertaining to the battery packs from lab tests of a manufacturer of the battery packs,
- third diverse data pertaining to synthetically generated data,
- fourth diverse data pertaining to a plurality of battery chemistries and the plurality of cell patterns' open-circuit voltage during charging and discharging;
- generating the diverse data by merging the first, second, third, and fourth diverse data for the plurality of battery chemistries and the plurality of cell patterns without any gaps in temperature, charging, discharging steps, and stress conditions pertaining to loads from light to heavy including extremities.

30. The computer-implemented method of any clause herein, wherein the diverse data is paired and stored with known state of charge labels for supervised learning and stored without any labels for unsupervised learning.

31. The computer-implemented method of any clause herein, wherein the diverse data is stored without any labels for unsupervised learning.

32 The computer-implemented method of any clause herein, wherein the second data comprises data pertaining to a single target battery chemistry and a single target cell structure.

33. The computer-implemented method of any clause herein, wherein first and second data comprise the open-circuit voltage tests of the plurality of battery cells and target battery cell generated by:
- measuring open-circuit voltage of a fully charged cell and discharging the cell in small increments to lower state of charge, resting for transients to dissipate and measuring open-circuit voltage at each increment and, once fully discharged, charging the cell to a new state of charge level in small increments, resting for transients to dissipate and measuring open-circuit voltage at each increment until the cell is fully charged and plotting a charging and discharging open-circuit voltage and state of charge graph allowing determination and storing state of charge labels for training.

34. A tangible, non-transitory computer-readable medium storing instructions that, when executed, cause a processing device to:

generate, at a cloud-based computing system, a computer-implemented model comprising a domain adaptation architecture, wherein the computer-implemented model is trained to predict a state of charge of a target battery cell, and the domain adaptation architecture comprises:
- a first private encoder that is pre-trained using first data pertaining to a plurality of battery cells in a fleet, a shared encoder that is trained using the first data and second data pertaining to a target battery cell, and a computer-implemented predictor that is trained to predict the state of charge of the target battery cell using output from the first private encoder and the shared encoder; and deploy, to an edge processing device, the shared encoder and the predictor to cause the edge processing device to predict the state of charge of the target battery cell when sensor data pertaining to a battery pack is received by the edge processing device.

35. The computer-readable medium of any clause herein, wherein the domain adaptation architecture comprises:

a second private encoder that is trained using the second data pertaining to the target battery cell, and a decoder that is trained to output at least one auxiliary task prediction based on output from the second private encoder and the shared encoder.

36 The computer-readable medium of any clause herein, further comprising:

receiving, at the cloud-based computing system, the sensor data;

determining whether a difference between the at least one auxiliary task prediction and the sensor data satisfy an error threshold;

responsive to determining that the difference satisfies the error threshold, retraining the shared encoder; and redeploying the shared encoder to the edge processing device.

37. The computer-readable medium of any clause herein, wherein the first private encoder and the computer-implemented predictor remained unmodified when the shared encoder is retrained.

38. The computer-readable medium of any clause herein, wherein the first private encoder, the shared encoder, and the computer-implemented predictor comprise one or more machine learning models.

39. The computer-readable medium of any clause herein, wherein the first data comprises fleet data pertaining to fleet battery cells' temperature, voltage, current, or some combination thereof, and the second data comprises target battery cell data pertaining to the target battery cell's temperature, voltage, current, or some combination thereof.

40. A system comprising:

one or more memory devices storing instructions; and one or more processing devices communicatively coupled to the one or more memory devices, wherein the one or more processing devices execute the instructions to:

generate, at a cloud-based computing system, a computer-implemented model comprising a domain adaptation architecture, wherein the computer-implemented model is trained to predict a state of charge of a target battery cell, and the domain adaptation architecture comprises:

a first private encoder that is pre-trained using first data pertaining to a plurality of battery cells in a fleet, a shared encoder that is trained using the first data and second data pertaining to a target battery cell, and a computer-implemented predictor that is trained to predict the state of charge of the target battery cell using output from the first private encoder and the shared encoder; and deploy, to an edge processing device, the shared encoder and the predictor to cause the edge processing device to predict the state of charge of the target battery cell when sensor data pertaining to a battery pack is received by the edge processing device.

41. A computer-implemented method comprising:

receiving, at an edge processing device from one or more sensors, data pertaining to a battery pack of a vehicle, wherein the data comprises a temperature, a voltage, a current, an Ampere-hour count, a state of health of the battery pack, or some combination thereof;

based on the data, determining, using one or more computer-implemented models executed via the edge processing device, a state of charge of the battery pack, wherein the one or more computer-implemented models comprise (i) a first component trained to process the data to generate processed data and (ii) a second component trained to use the processed data to predict the state of charge of the battery pack; and displaying, using the edge processing device, the state of charge of the battery pack on a user interface of a display.

42. The computer-implemented method of any clause herein, further comprising controlling, based on the state of charge of the battery pack, operation of the vehicle, charging of the battery pack, or both.

43. The computer-implemented method of any clause herein, further comprising:

receiving, from a cloud-based computing system, one or more parameters of the one or more computer-implemented models;

configuring, using the one or more parameters, the one or more computer-implemented models.

44. The computer-implemented method of any clause herein, wherein the first component comprises a shared encoder implemented by a first machine learning model and the second component comprises a predictor implemented by a second machine learning model.

45. The computer-implemented method of any clause herein, further comprising filtering the data to remove noise from the data.

46. The computer-implemented method of any clause herein, further comprising:

transmitting, to a cloud-based computing system, the data and the state of charge of the battery pack to a cloud-based computing system, wherein:

the cloud-based computing system is configured to determine whether the data differs from predicted auxiliary task values by a threshold error, responsive to determining that the data differs from the predicted auxiliary task values by the threshold error, the cloud-based computing system is configured to retrain, using fleet data, the first component while leaving the second component unmodified, and the cloud-based computing system is configured to redeploy the first component to the edge processing device.

47. The computer-implemented method of any clause herein, wherein the first component is trained at a cloud-based computing system using first data pertaining to a target battery cell included in the battery pack and second data pertaining to a plurality of battery cells included in a fleet of battery packs, and the second component is trained using the second data pertaining to the plurality of battery cells included in the fleet of battery packs.

48. The computer-implemented method of any clause herein, wherein the cloud-based computing system stores the second data as diverse data pertaining to a plurality of battery chemistries and a plurality of cell patterns, wherein the diverse data pertains to a battery pack current, a cell voltage, a cell current, a cell temperature, or some combination thereof under a range of temperatures comprising extremities, varying charging, varying discharging, and varying stress conditions, wherein the diverse data comprises:
  first diverse data received from sensors of battery packs,
  second diverse data pertaining to the battery packs from lab tests of a manufacturer of the battery packs,
  third diverse data pertaining to synthetically generated data,
  fourth diverse data pertaining to a plurality of battery chemistries and the plurality of cell patterns' open-circuit voltage during charging and discharging; and
  generating the diverse data by merging the first, second, third, and fourth diverse data for the plurality of battery chemistries and the plurality of cell patterns without any gaps in temperature, charging, discharging steps, and stress conditions pertaining to loads from light to heavy including extremities.

49. The computer-implemented method of any clause herein, wherein the diverse data is paired and stored with known state of charge labels for supervised learning and stored without any labels for unsupervised learning.

50. The computer-implemented method of any clause herein, wherein the first data comprises data pertaining to a single target battery chemistry and a single target cell structure.

51. The computer-implemented method of any clause herein, wherein the first and second data comprise the open-circuit voltage tests of the plurality of battery cells and target battery cell generated by:
  measuring open-circuit voltage of a fully charged cell and discharging the cell in small increments to lower state of charge, resting for transients to dissipate and measuring open-circuit voltage at each increment and, once fully discharged, charging the cell to a new state of charge level in small increments, resting for transients to dissipate and measuring open-circuit voltage at each increment until the cell is fully charged and plotting a charging and discharging open-circuit voltage and state of charge graph allowing determination and storing state of charge labels for training.

52. A tangible, non-transitory computer-readable medium storing instructions that, when executed, cause a processing device to:
  receive, at an edge processing device from one or more sensors, data pertaining to a battery pack of a vehicle, wherein the data comprises a temperature, a voltage, a current, an Ampere-hour count, a state of health of the battery pack, or some combination thereof;
  based on the data, determine, using one or more computer-implemented models executed via the edge processing device, a state of charge of the battery pack, wherein the one or more computer-implemented models comprise (i) a first component trained to process the data to generate processed data and (ii) a second component trained to use the processed data to predict the state of charge of the battery pack; and
  display, using the edge processing device, the state of charge of the battery pack on a user interface of a display.

53. The computer-readable medium of any clause herein, wherein the processing device is further to control, based on the state of charge of the battery pack, operation of the vehicle, charging of the battery pack, or both.

54. The computer-readable medium of any clause herein, wherein the processing device is further to:
  receive, from a cloud-based computing system, one or more parameters of the one or more computer-implemented models;
  configure, using the one or more parameters, the one or more computer-implemented models.

55. The computer-readable medium of any clause herein, wherein the first component comprises a shared encoder implemented by a first machine learning model and the second component comprises a predictor implemented by a second machine learning model.

56. The computer-readable medium of any clause herein, wherein the processing device is further to filter the data to remove noise from the data.

57. The computer-readable medium of any clause herein, wherein the processing device is further to:
  transmit, to a cloud-based computing system, the data and the state of charge of the battery pack to a cloud-based computing system, wherein:
  the cloud-based computing system is configured to determine whether the data differs from predicted auxiliary task values by a threshold error,
  responsive to determining that the data differs from the predicted auxiliary task values by the threshold error, the cloud-based computing system is configured to retrain, using fleet data, the first component while leaving the second component unmodified, and
  the cloud-based computing system is configured to redeploy the first component to the edge processing device.

58. The computer-readable medium of any clause herein, wherein the first component is trained at a cloud-based computing system using first data pertaining to a target battery cell included in the battery pack and second data pertaining to a plurality of battery cells included in a fleet of battery packs, and the second component is trained using the second data pertaining to the plurality of battery cells included in the fleet of battery packs.

59. The computer-readable medium of any clause herein, wherein the cloud-based computing system stores the second data as diverse data pertaining to a plurality of battery chemistries and a plurality of cell patterns, wherein the diverse data pertains to a battery pack current, a cell voltage, a cell current, a cell temperature, or some combination thereof under a range of temperatures comprising extremities, varying charging, varying discharging, and varying stress conditions, wherein the diverse data comprises:
  first diverse data received from sensors of battery packs,
  second diverse data pertaining to the battery packs from lab tests of a manufacturer of the battery packs,
  third diverse data pertaining to synthetically generated data,
  fourth diverse data pertaining to a plurality of battery chemistries and the plurality of cell patterns' open-circuit voltage during charging and discharging; and
  generating the diverse data by merging the first, second, third, and fourth diverse data for the plurality of battery chemistries and the plurality of cell patterns without any gaps in temperature, charging, discharging steps, and stress conditions pertaining to loads from light to heavy including extremities.

60. A system comprising:
  one or more memory devices storing instructions; and
  one or more processing devices communicatively coupled to the one or more memory devices, wherein the one or more processing devices executed the instructions to:
  receive, at an edge processing device from one or more sensors, data pertaining to a battery pack of a vehicle, wherein the data comprises a temperature, a voltage, a current, an Ampere-hour count, a state of health of the battery pack, or some combination thereof;

based on the data, determine, using one or more computer-implemented models executed via the edge processing device, a state of charge of the battery pack, wherein the one or more computer-implemented models comprise (i) a first component trained to process the data to generate processed data and (ii) a second component trained to use the processed data to predict the state of charge of the battery pack; and display, using the edge processing device, the state of charge of the battery pack on a user interface of a display.

61. A computer-implemented method comprising:

generating, using a cloud-based computing system, a computer-implemented model trained to predict at least a state of charge of a battery pack, wherein the computer-implemented model comprises one or more pre-trained components comprising one or more frozen weights and one or more tunable components comprising one or more tunable weights;

receiving sensor data pertaining to a target cell of a battery pack;

determining, using the one or more tunable components, a plurality of auxiliary task predictions;

determining if a difference between the plurality of auxiliary task predictions and the sensor data satisfies an error threshold;

responsive to determining the difference satisfies the error threshold, modifying, using fleet data, the one or more tunable weights of the one or more tunable components while leaving the one or more frozen weights of the one or more pre-trained components unmodified; and transmitting, to an edge processing device, the one or more tunable weights to cause the one or more tunable components to be updated at the edge processing device.

62. The computer-implemented method of any clause herein, wherein the edge processing device executes at least one of the one or more tunable components and at least one of the one or more pre-trained components to predict at least the state of charge of the battery pack.

63. The computer-implemented method of any clause herein, wherein the at least one of the one or more tunable components comprises a shared encoder and the at least one of the one or more pre-trained components comprises a predictor.

64. The computer-implemented method of any clause herein, wherein the edge processing device predicts the state of charge of the battery pack in real-time or near real-time as subsequent sensor data is received without contacting the cloud-based computing system.

65. The computer-implemented method of any clause herein, wherein at least some of the one or more pre-trained components comprise one or more machine learning models trained using supervised learning and a training dataset comprising labeled state of charge data.

66. The computer-implemented method of any clause herein, wherein:

the training dataset comprises a diverse data pertaining to a plurality of battery chemistries and a plurality of cell patterns, wherein the diverse data pertains to a battery pack current, a cell voltage, a cell current, a cell temperature, or some combination thereof under a range of temperatures comprising extremities, varying charging, varying discharging, and varying stress conditions, wherein the diverse data comprises:

first diverse data received from sensors of batteries operating in the field, second diverse data pertaining to the battery pack from the lab tests of a manufacturer of the battery packs, third diverse data pertaining to synthetically generated data, fourth diverse data pertaining to a plurality of battery chemistries and the plurality of cell patterns' open-circuit voltage during charging and discharging, and the diverse data is generated by merging the first, second, third, and fourth diverse data for the plurality of battery chemistries and the plurality of cell patterns without any gaps in temperature, charging, discharging steps, and stress conditions pertaining to loads from light to heavy including extremities.

67. The computer-implemented method of any clause herein, wherein at least some of the one or more tunable components comprise one or more machine learning models trained using self-supervised learning.

68. The computer-implemented method of any clause herein, further comprising the difference is determined using a mean square error, a mean absolute error, or both.

69. A tangible, non-transitory computer-readable medium storing instructions that, when executed, cause a processing device to:

generate, using a cloud-based computing system, a computer-implemented model trained to predict at least a state of charge of a battery pack, wherein the computer-implemented model comprises one or more pre-trained components comprising one or more frozen weights and one or more tunable components comprising one or more tunable weights;

receive sensor data pertaining to a target cell of a battery pack;

determine, using the one or more tunable components, a plurality of auxiliary task predictions;

determine if a difference between the plurality of auxiliary task predictions and the sensor data satisfies an error threshold;

responsive to determining the difference satisfies the error threshold, modify, using fleet data, the one or more tunable weights of the one or more tunable components while leaving the one or more frozen weights of the one or more pre-trained components unmodified; and transmit, to an edge processing device, the one or more tunable weights to cause the one or more tunable components to be updated at the edge processing device.

70. The computer-readable medium of any clause herein, wherein the edge processing device executes at least one of the one or more tunable components and at least one of the one or more pre-trained components to predict at least the state of charge of the battery pack.

71. The computer-readable medium of any clause herein, wherein the at least one of the one or more tunable components comprises a shared encoder and the at least one of the one or more pre-trained components comprises a predictor.

72. The computer-readable medium of any clause herein, wherein the edge processing device predicts the state of charge of the battery pack in real-time or near real-time as subsequent sensor data is received without contacting the cloud-based computing system.

73. The computer-readable medium of any clause herein, wherein at least some of the one or more pre-trained components comprise one or more machine learning models trained using supervised learning and a training dataset comprising labeled state of charge data.

74. The computer-readable medium of any clause herein, wherein:
  the training dataset comprises a diverse data pertaining to a plurality of battery chemistries and a plurality of cell patterns, wherein the diverse data pertains to a battery pack current, a cell voltage, a cell current, a cell temperature, or some combination thereof under a range of temperatures comprising extremities, varying charging, varying discharging, and varying stress conditions, wherein the diverse data comprises:
    first diverse data received from sensors of batteries operating in the field,
    second diverse data pertaining to the battery pack from the lab tests of a manufacturer of the battery packs,
    third diverse data pertaining to synthetically generated data,
    fourth diverse data pertaining to a plurality of battery chemistries and the plurality of cell patterns' open-circuit voltage during charging and discharging, and
      the diverse data is generated by merging the first, second, third, and fourth diverse data for the plurality of battery chemistries and the plurality of cell patterns without any gaps in temperature, charging, discharging steps, and stress conditions pertaining to loads from light to heavy including extremities.

75. The computer-readable medium of any clause herein, wherein at least some of the one or more tunable components comprise one or more machine learning models trained using self-supervised learning.

76. The computer-readable medium of any clause herein, wherein the processing device is further to the difference is determined using a mean square error, a mean absolute error, or both.

77. A system comprising:
  one or more memory devices storing instructions; and
  one or more processing devices communicatively coupled to the one or more memory devices, wherein the one or more processing devices execute the instructions to:
    generate, using a cloud-based computing system, a computer-implemented model trained to predict at least a state of charge of a battery pack, wherein the computer-implemented model comprises one or more pre-trained components comprising one or more frozen weights and one or more tunable components comprising one or more tunable weights;
    receive sensor data pertaining to a target cell of a battery pack;
    determine, using the one or more tunable components, a plurality of auxiliary task predictions;
    determine if a difference between the plurality of auxiliary task predictions and the sensor data satisfies an error threshold;
    responsive to determining the difference satisfies the error threshold, modify, using fleet data, the one or more tunable weights of the one or more tunable components while leaving the one or more frozen weights of the one or more pre-trained components unmodified; and
    transmit, to an edge processing device, the one or more tunable weights to cause the one or more tunable components to be updated at the edge processing device.

78. The system of any clause herein, wherein the edge processing device executes at least one of the one or more tunable components and at least one of the one or more pre-trained components to predict at least the state of charge of the battery pack.

79. The system of any clause herein, wherein the at least one of the one or more tunable components comprises a shared encoder and the at least one of the one or more pre-trained components comprises a predictor.

80. The system of any clause herein, wherein the edge processing device predicts the state of charge of the battery pack in real-time or near real-time as subsequent sensor data is received without contacting the cloud-based computing system.

What is claimed is:

1. A computer-implemented method comprising:
  receiving, from one or more sensors, one or more measurements comprising battery cell voltage, current, temperature, or some combination thereof;
  determining, via one or more first computer-implemented models using the one or more measurements, a state of charge prediction, wherein:
    the one or more first computer-implemented models are initially trained to determine the state of charge prediction using a first training dataset comprising data pertaining to a plurality of battery cells generated based on at least one of state of charge tests of the plurality of battery cells, open-circuit voltage tests of the plurality of battery cells, and drive cycle tests of the plurality of battery cells,
    the one or more first computer-implemented models are additionally trained to determine the state of charge prediction using a second training dataset comprising data pertaining to a target battery cell generated based on at least one of state of charge tests of the target battery cell, open-circuit voltage tests of the target battery cell, and drive cycle tests of the target battery cell; and
  transmitting one or more parameters of the one or more first computer-implemented models to an edge processing device to cause the edge processing device to execute at least a portion of the one more first computer-implemented models to predict the state of charge prediction and to control operation of a battery pack based on the state of charge prediction.

2. The computer-implemented method of claim 1, wherein the one or more first computer-implemented models are initially trained by:
  storing the first training dataset as diverse data pertaining to a plurality of battery chemistries and a plurality of cell patterns, wherein the diverse data pertains to a battery pack current, a cell voltage, a cell current, a cell temperature, or some combination thereof under a range of temperatures comprising extremities, varying charging, varying discharging, and varying stress conditions, wherein the diverse data comprises:
    first diverse data received from sensors of battery packs,
    second diverse data pertaining to the battery packs from lab tests of a manufacturer of the battery packs,
    third diverse data pertaining to synthetically generated data associated with the battery packs,
    fourth diverse data pertaining to a plurality of battery chemistries and the plurality of cell patterns' open-circuit voltage during charging and discharging; and
  generating the diverse data by merging the first, second, third, and fourth diverse data for the plurality of battery chemistries and the plurality of cell patterns without any gaps in temperature, charging, discharging steps, and stress conditions pertaining to loads from light to heavy including extremities.

3. The computer-implemented method of claim 2, wherein the diverse data is paired and stored with known state of charge labels for supervised learning and stored without any labels for unsupervised learning.

4. The computer-implemented method of claim 1, wherein the second training dataset comprises data pertaining to a single target battery chemistry and a single target cell structure.

5. The computer-implemented method of claim 1, wherein the first and second training datasets comprise the open-circuit voltage tests of the plurality of battery cells and target battery cell generated by:
measuring open-circuit voltage of a fully charged cell and discharging the cell in small increments to lower state of charge, resting for transients to dissipate and measuring open-circuit voltage at each increment and, once fully discharged, charging the cell to a new state of charge level in small increments, resting for transients to dissipate and measuring open-circuit voltage at each increment until the cell is fully charged and plotting a charging and discharging open-circuit voltage and state of charge graph allowing determination and storing state of charge labels for training.

6. The computer-implemented method of claim 1, further comprising, based on the state of charge prediction of the battery pack, controlling operation of a vehicle, charging of the battery pack, or both.

7. The computer-implemented method of claim 1, further comprising generating, using one or more simulated battery usage conditions, synthetic data to include in the first training dataset, wherein the one or more simulated battery usage conditions comprise edge cases or rare events.

8. The computer-implemented method of claim 1, wherein the state of charge tests measure voltage across terminals of battery packs comprising the plurality of battery cells, the target battery cell, or some combination thereof when they are not connected to any load.

9. The computer-implemented method of claim 1, wherein the open-circuit voltage tests measure voltage of battery packs at different state of charge levels under no-load conditions.

10. The computer-implemented method of claim 1, wherein the drive cycle tests simulate real-world driving conditions to evaluate battery performance under dynamic load and varying temperature conditions.

11. The computer-implemented method of claim 1, wherein:
the edge processing device determines, using one or more second computer-implemented models, a state of health prediction of the battery pack, wherein the state of health prediction relates to a degradation of the battery pack, and
the edge processing device determines, via the at least the portion of the one or more first computer-implemented models and using the state of health prediction of the battery pack, the state of charge prediction of the battery pack.

12. The computer-implemented method of claim 1, further comprising preprocessing on the edge the one or more measurements by filtering noise from sensor data, extracting features, or some combination thereof to refine the one or more measurements.

13. The computer-implemented method of claim 1, wherein the one or more first computer-implemented models comprise one or more machine learning models.

14. A tangible, non-transitory computer-readable medium storing instructions that, when executed, cause a processing device to:
receive, from one or more sensors, one or more measurements comprising battery cell voltage, current, temperature, or some combination thereof;
determine, via one or more first computer-implemented models using the one or more measurements, a state of charge prediction, wherein:
the one or more first computer-implemented models are initially trained to determine the state of charge prediction using a first training dataset comprising data pertaining to a plurality of battery cells generated based on at least one of state of charge tests of the plurality of battery cells, open-circuit voltage tests of the plurality of battery cells, and drive cycle tests of the plurality of battery cells,
the one or more first computer-implemented models are additionally trained to determine the state of charge prediction using a second training dataset comprising data pertaining to a target battery cell generated based on at least one of state of charge tests of the target battery cell, open-circuit voltage tests of the target battery cell, and drive cycle tests of the target battery cell; and
transmit one or more parameters of the one or more first computer-implemented models to an edge processing device to cause the edge processing device to execute at least a portion of the one more first computer-implemented models to predict the state of charge prediction and to control operation of a battery pack based on the state of charge prediction.

15. The computer-readable medium of claim 14, wherein the one or more first computer-implemented models are initially trained by:
storing the first training dataset as diverse data pertaining to a plurality of battery chemistries and a plurality of cell patterns, wherein the diverse data pertains to a battery pack current, a cell voltage, a cell current, a cell temperature, or some combination thereof under a range of temperatures comprising extremities, varying charging, varying discharging, and varying stress conditions, wherein the diverse data comprises:
first diverse data received from sensors of battery packs,
second diverse data pertaining to the battery packs from lab tests of a manufacturer of the battery packs,
third diverse data pertaining to synthetically generated data associated with the battery packs,
fourth diverse data pertaining to a plurality of battery chemistries and the plurality of cell patterns' open-circuit voltage during charging and discharging; and
generating the diverse data by merging the first, second, third, and fourth diverse data for the plurality of battery chemistries and the plurality of cell patterns without any gaps in temperature, charging, discharging steps, and stress conditions pertaining to loads from light to heavy including extremities.

16. The computer-readable medium of claim 15, wherein the diverse data is paired and stored with known state of charge labels for supervised learning and stored without any labels for unsupervised learning.

17. The computer-readable medium of claim 14, wherein the second training dataset comprises data pertaining to a single target battery chemistry and a single target cell structure.

18. The computer-readable medium of claim 14, wherein the first and second training datasets comprise the open-circuit voltage tests of the plurality of battery cells and target battery cell generated by:
  measuring open-circuit voltage of a fully charged cell and discharging the cell in small increments to lower state of charge, resting for transients to dissipate and measuring open-circuit voltage at each increment and, once fully discharged, charging the cell to a new state of charge level in small increments, resting for transients to dissipate and measuring open-circuit voltage at each increment until the cell is fully charged and plotting a charging and discharging open-circuit voltage and state of charge graph allowing determination and storing state of charge labels for training.

19. The computer-readable medium of claim 14, wherein the processing device is further to, based on the state of charge prediction of the battery pack, control operation of a vehicle, charging of the battery pack, or both.

20. A system comprising:
  one or more memory devices storing instructions; and
  one or more processing devices communicatively coupled to the one or more memory devices, wherein the one or more processing devices execute the instructions to:
    receive, from one or more sensors, one or more measurements comprising battery cell voltage, current, temperature, or some combination thereof;
    determine, via one or more first computer-implemented models using the one or more measurements, a state of charge prediction, wherein:
      the one or more first computer-implemented models are initially trained to determine the state of charge prediction using a first training dataset comprising data pertaining to a plurality of battery cells generated based on at least one of state of charge tests of the plurality of battery cells, open-circuit voltage tests of the plurality of battery cells, and drive cycle tests of the plurality of battery cells,
      the one or more first computer-implemented models are additionally trained to determine the state of charge prediction using a second training dataset comprising data pertaining to a target battery cell generated based on at least one of state of charge tests of the target battery cell, open-circuit voltage tests of the target battery cell, and drive cycle tests of the target battery cell; and
    transmit one or more parameters of the one or more first computer-implemented models to an edge processing device to cause the edge processing device to execute at least a portion of the one more first computer-implemented models to predict the state of charge prediction and to control operation of a battery pack based on the state of charge prediction.

\* \* \* \* \*